ated under 35

United States Patent
Bailey et al.

(10) Patent No.: US 10,248,381 B2
(45) Date of Patent: Apr. 2, 2019

(54) AUDIO CONTROL SYSTEM AND RELATED METHODS

(71) Applicant: iZotope, Inc., Cambridge, MA (US)

(72) Inventors: Jonathan Bailey, Brooklyn, NY (US); Todd Baker, Hampstead, NH (US); Brett Bunting, Edinburgh (GB); Mark Ethier, Somerville, MA (US); Matt Fuerch, Minneapolis, MN (US)

(73) Assignee: iZotope, Inc., Cambridge, MA (US)

( * ) Notice: Subject to any disclaimer, the term of this patent is extended or adjusted under 35 U.S.C. 154(b) by 0 days.

(21) Appl. No.: 16/182,500

(22) Filed: Nov. 6, 2018

(65) Prior Publication Data

US 2019/0073191 A1     Mar. 7, 2019

Related U.S. Application Data

(60) Division of application No. 16/034,691, filed on Jul. 13, 2018, now Pat. No. 10,171,055, which is a
(Continued)

(51) Int. Cl.
*G06F 3/16* (2006.01)
*G10L 19/00* (2013.01)
(Continued)

(52) U.S. Cl.
CPC ............ *G06F 3/165* (2013.01); *G06F 3/0482* (2013.01); *G06F 3/04847* (2013.01); *G06F 3/04883* (2013.01); *G06F 3/167* (2013.01); *G10L 19/00* (2013.01); *G11B 27/34* (2013.01); *H03F 3/183* (2013.01); *H03G 3/301* (2013.01);
(Continued)

(58) Field of Classification Search
CPC .... H03G 3/3005; H03G 3/3089; H03G 7/007; H03G 9/005; H03G 7/002; H03G 5/165; H03G 3/301; H03G 5/005; H03G 2201/103; G06F 3/165; G06F 3/0482; G06F 3/04847; G06F 3/167; G06F 3/04883; G10L 19/00;
(Continued)

(56) References Cited

U.S. PATENT DOCUMENTS 4,359,602 A   11/1982  Ponto et al.
5,034,701 A    7/1991  Debroux
(Continued)

FOREIGN PATENT DOCUMENTS

WO   WO 2018/144367   8/2018

OTHER PUBLICATIONS

Invitation to Pay Additional Fees dated Apr. 2, 2018 in connection with International Application No. PCT/US2018/015655.
(Continued)

*Primary Examiner* — Paul Kim
(74) *Attorney, Agent, or Firm* — Wolf, Greenfield & Sacks, P.C.

(57) ABSTRACT

Some embodiments of the invention are directed to an audio production system which is more portable, less expensive, faster to set up, and simpler and easier to use than conventional audio production tools. An audio production system implemented in accordance with some embodiments of the invention may therefore be more accessible to the typical user, and easier and more enjoyable to use, than conventional audio production tools.

32 Claims, 16 Drawing Sheets

Related U.S. Application Data continuation of application No. PCT/US2018/015655, filed on Jan. 29, 2018.

(60) Provisional application No. 62/454,138, filed on Feb. 3, 2017.

(51) Int. Cl.

| | | |
|---|---|---|
| *H04Q 3/64* | (2006.01) | |
| *H04B 1/034* | (2006.01) | |
| *G11B 27/34* | (2006.01) | |
| *G06F 3/0488* | (2013.01) | |
| *G06F 3/0484* | (2013.01) | |
| *G06F 3/0482* | (2013.01) | |
| *H03G 5/16* | (2006.01) | |
| *H03F 3/183* | (2006.01) | |
| *H03G 9/00* | (2006.01) | |
| *H03G 7/00* | (2006.01) | |
| *H03G 5/00* | (2006.01) | |
| *H03G 3/30* | (2006.01) | |

(52) U.S. Cl.
CPC ......... *H03G 3/3005* (2013.01); *H03G 3/3089* (2013.01); *H03G 5/005* (2013.01); *H03G 5/165* (2013.01); *H03G 7/002* (2013.01); *H03G 7/007* (2013.01); *H03G 9/005* (2013.01); *H04B 1/034* (2013.01); *H04Q 3/64* (2013.01); *G10H 2210/056* (2013.01); *H03F 2200/03* (2013.01); *H03G 2201/103* (2013.01)

(58) Field of Classification Search
CPC ..... H03F 2200/03; H03F 3/183; G11B 27/34; H04B 1/034; G10H 2210/056; H04Q 3/64

USPC ........................................................ 381/107
See application file for complete search history.

(56) References Cited

U.S. PATENT DOCUMENTS

| | | |
|---|---|---|
| 5,768,399 A | 6/1998 | Statham et al. |
| 2004/0136549 A1 | 7/2004 | Pennock et al. |
| 2006/0126865 A1 | 6/2006 | Blarney et al. |
| 2007/0189246 A1 | 8/2007 | Molnar |
| 2008/0056145 A1 | 3/2008 | Woodworth |
| 2009/0274310 A1 | 11/2009 | Taenzer |
| 2010/0281367 A1 | 11/2010 | Langmacher et al. |
| 2010/0305732 A1 | 12/2010 | Serletic |
| 2011/0184540 A1* | 7/2011 | Huang .................. H03G 3/301 700/94 |
| 2012/0170771 A1 | 7/2012 | Tsai et al. |
| 2013/0039496 A1 | 2/2013 | Grandinetti et al. |
| 2014/0115468 A1 | 4/2014 | Guerrero |
| 2014/0140537 A1 | 5/2014 | Soulodre |
| 2014/0198923 A1 | 7/2014 | Miet et al. |
| 2014/0313336 A1 | 10/2014 | Predmore, II |
| 2014/0350935 A1 | 11/2014 | Schuster et al. |
| 2016/0049915 A1 | 2/2016 | Wang et al. |
| 2016/0164480 A1 | 6/2016 | Shuttleworth |
| 2018/0321904 A1 | 11/2018 | Bailey et al. |
| 2018/0321908 A1 | 11/2018 | Bailey et al. |
| 2018/0323763 A1 | 11/2018 | Bailey et al. |

OTHER PUBLICATIONS

International Search Report and Written Opinion dated Jun. 11, 2018 in connection with International Application No. PCT/US2018/015655.

\* cited by examiner

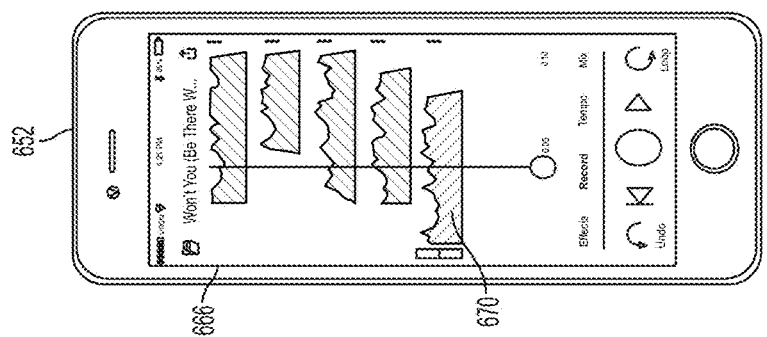
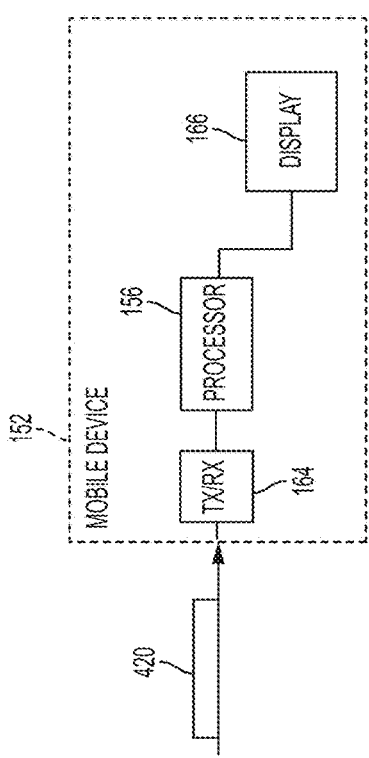
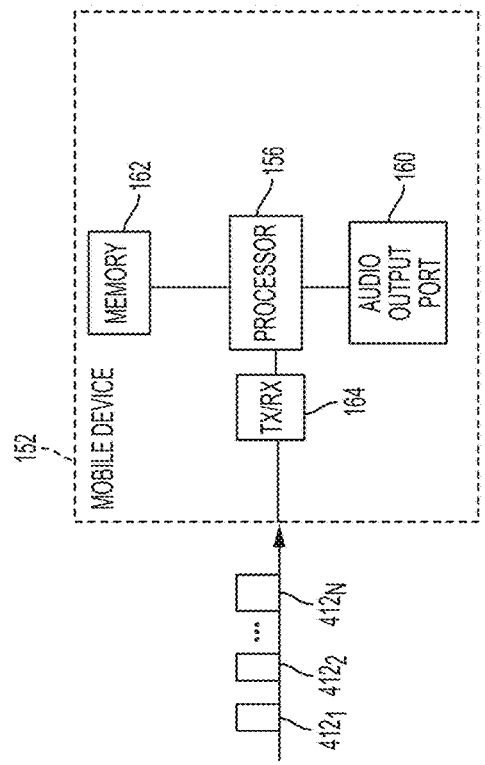

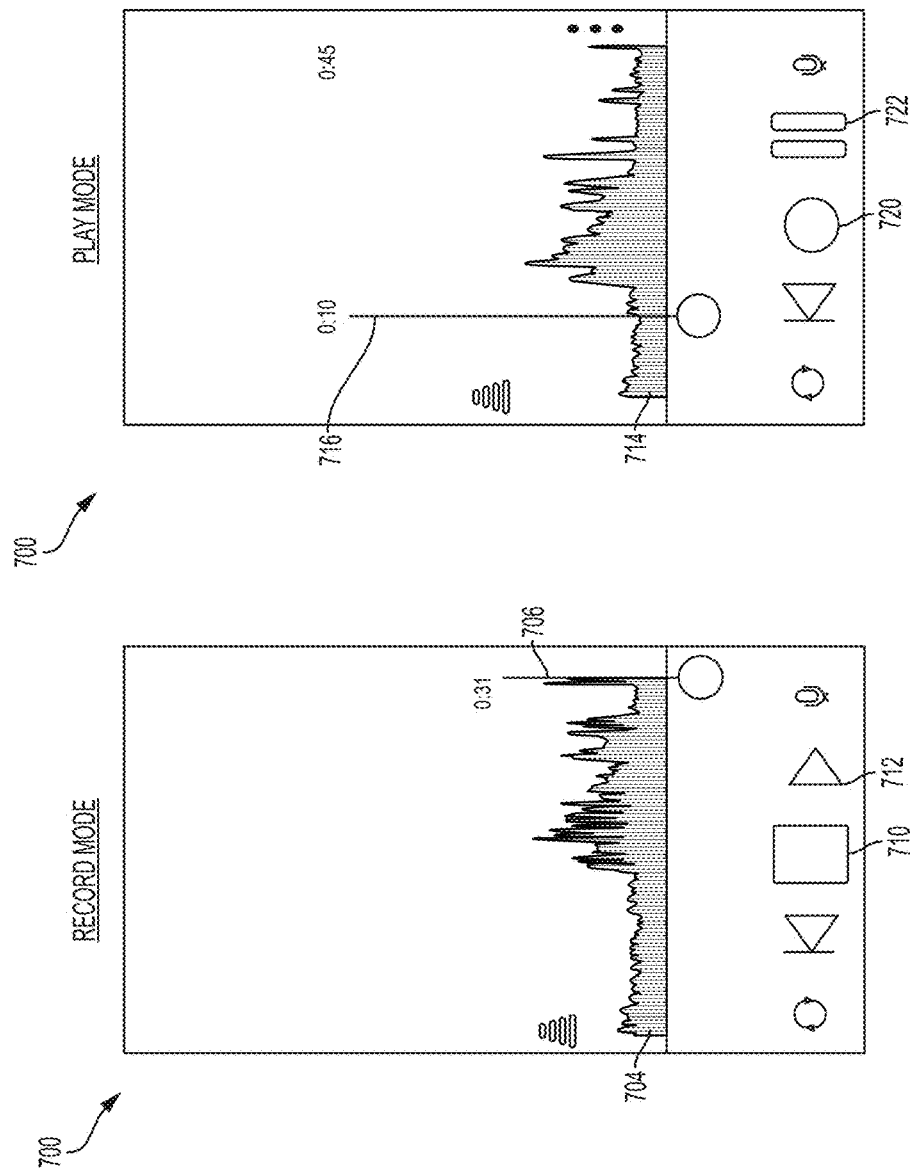

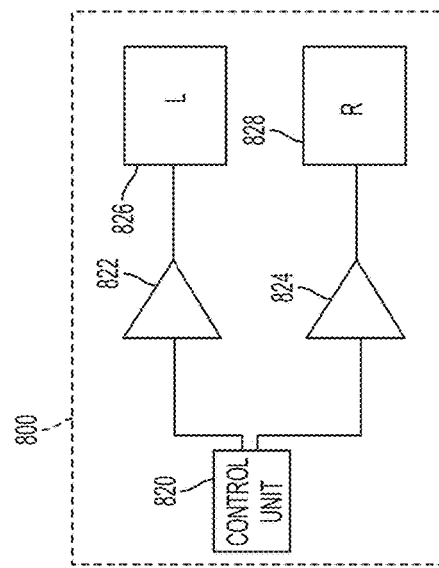
FIG. 8B
FIG. 8C
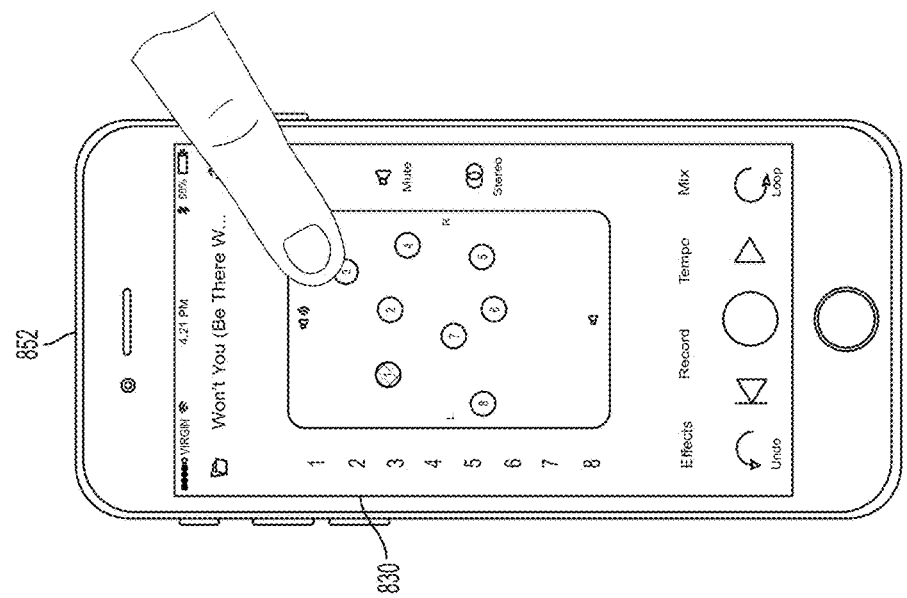
FIG. 8A

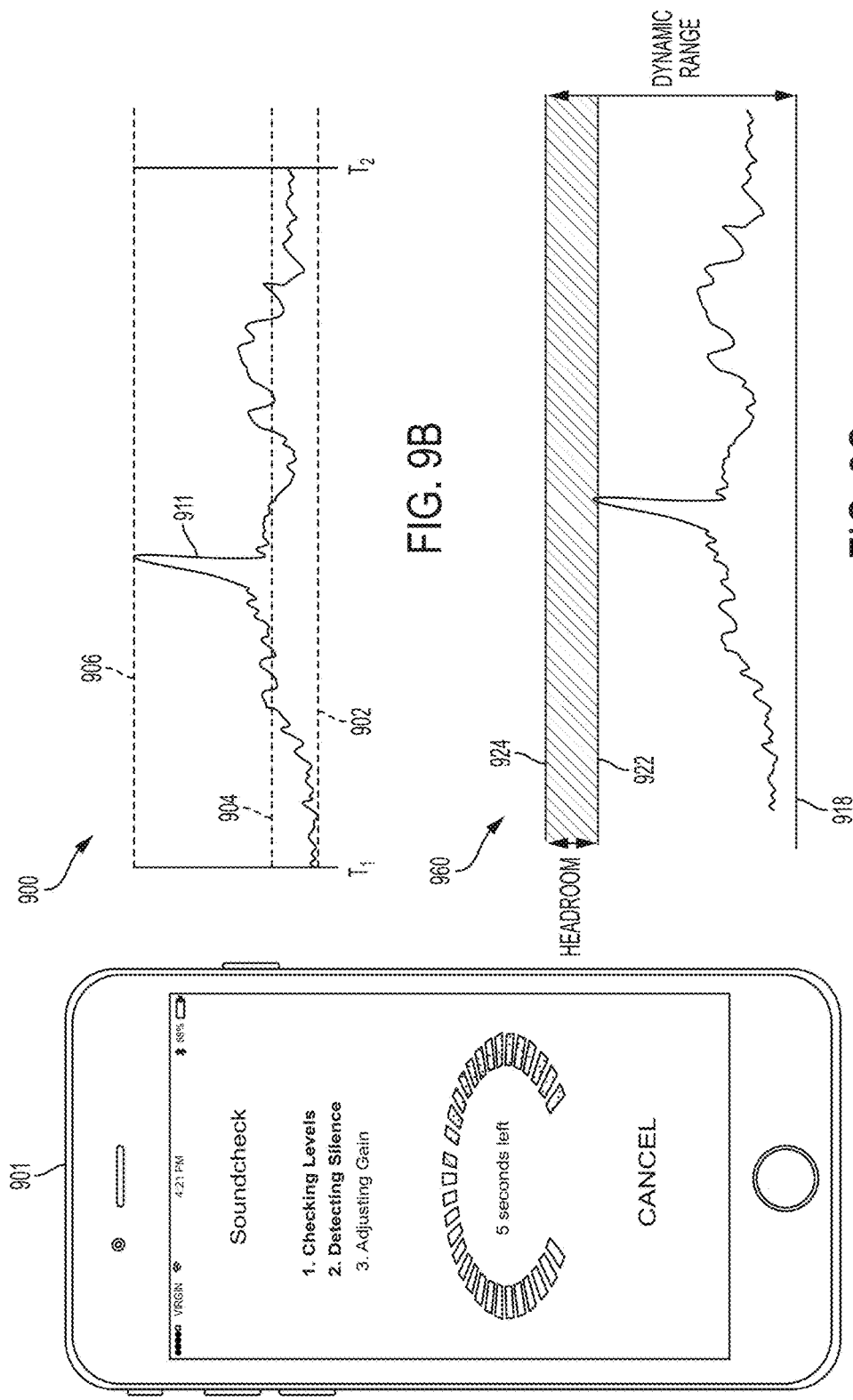

AUDIO CONTROL SYSTEM AND RELATED METHODS

RELATED APPLICATIONS

This application is a divisional of co-pending, commonly assigned U.S. patent application Ser. No. 16/034,691, filed Jul. 13, 2018, entitled "Audio Control System And Related Methods," which is a continuation of co-pending, commonly assigned International Application No. PCT/US2018/015655, filed Jan. 29, 2018, entitled "Audio Control System And Related Methods," which claims priority to commonly assigned U.S. Provisional Patent Application Ser. No. 62/454,138, filed Feb. 3, 2017, entitled "Audio Control System And Related Methods". The entirety of each of the applications listed above is incorporated herein by reference.

BACKGROUND INFORMATION

Audio production tools exist that enable users to produce high-quality audio. For example, some audio production tools include electronic devices and/or computer software applications, and they enable users to record one or more audio sources (e.g., vocals and/or speech captured by a microphone, music played with an instrument, etc.), process the audio (e.g., to master, mix, design, and/or otherwise manipulate the audio), and/or control its playback. Audio production tools may be used to produce audio comprising music, speech, sound effects, and/or other sounds.

Computer-implemented audio production tools often provide a graphical user interface with which users may complete various production tasks on audio source inputs, such as from a microphone or instrument. For example, some tools may receive audio input and generate one or more digital representations of the input, which a user may manipulate, such as to obtain desired audio output through filtering, equalization and/or other operations.

Conventional audio production tools often also enable a user to "map" audio source inputs to corresponding tracks. In this respect, a "track" is a component of an audio or video recording that is distinct from other components of the recording. For example, the lead vocals for a song may be mapped to one track, the drums for the song may be mapped to another track, the lead guitar may be mapped to yet another track, etc. In some situations (e.g., in live performances), multiple audio inputs may be recorded at the same time and mapped to multiple corresponding tracks, while in other situations (e.g., in recording studios), the various audio inputs collectively comprising a body of audio may be recorded at different times and mapped to corresponding tracks.

BRIEF DESCRIPTION OF DRAWINGS

Various aspects and embodiments of the invention are described below with reference to the following figures. It should be appreciated that the figures are not necessarily drawn to scale. Items appearing in multiple figures are indicated by the same reference number in all the figures in which they appear.

FIG. 6A is a schematic diagram illustrating reception of a low resolution (LR) sequence with a mobile device, according to some non-limiting embodiments.

FIG. 6B is schematic diagram illustrating a mobile device displaying a waveform, according to some non-limiting embodiments.

FIG. 6C is a schematic diagram illustrating reception of a high resolution (HR) sequence with a mobile device, according to some non-limiting embodiments.

FIG. 7A is a schematic diagram illustrating an example of a waveform displayed in a record mode, according to some non-limiting embodiments.

FIG. 7B is a schematic diagram illustrating an example of a waveform displayed in a play mode, according to some non-limiting embodiments.

FIG. 8A is a schematic diagram illustrating a mobile device configured to receive gain and pan information, according to some non-limiting embodiments.

FIG. 8B is a table illustrating examples of gain and pan information, according to some non-limiting embodiments.

FIG. 8C is a block diagram illustrating an example of a stereo sound system, according to some non-limiting embodiments.

FIG. 9A is a schematic diagram illustrating a mobile device performing a sound check routine, according to some non-limiting embodiments.

FIG. 9B is a schematic diagram illustrating an example of an audio input received in a sound check routine, according to some non-limiting embodiments.

FIG. 9C is a schematic diagram illustrating an example of an audio output obtained from a sound check routine, according to some non-limiting embodiments.

DETAILED DESCRIPTION

I. Overview

Figure 1A:
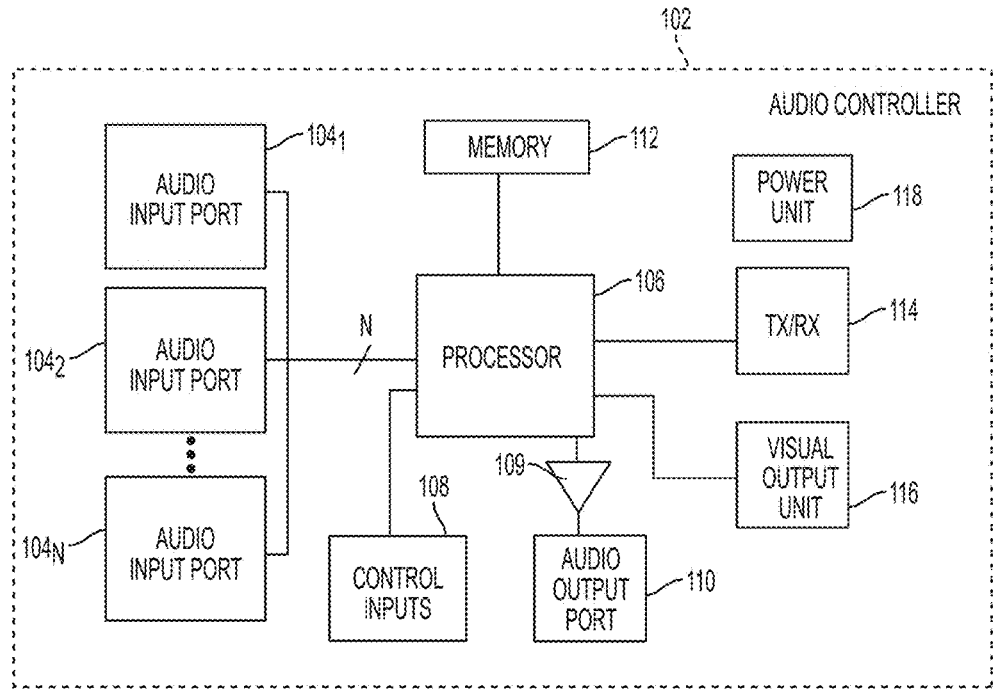
FIG. 1A is a block diagram illustrating an audio controller of an audio recording system, according to some non-limiting embodiments.

The Assignee has appreciated that, for a significant number of users, conventional audio production tools suffer from four main deficiencies. First, conventional audio production tools are expensive. In this respect, many audio production tools are designed (and priced) for use by professional audio engineers to produce audio for professional musicians, studios and/or other high-end users. As a result, these tools are financially out of reach of many who may benefit from their features.

Second, producing audio using conventional audio production tools is time- and labor-intensive, and requires specialized expertise. As one example, mapping an audio recording to a corresponding track typically requires a number of manual steps. For example, a user may be forced to first create the new track using a software program, and then manually pair audio source input to the new track, and then ensure that the audio input is being produced and captured in the manner needed to combine the track with other tracks. This process may then be repeated for each additional track. As a result of the time- and labor-intensive nature of many types of audio production tasks, many potential users are discouraged from using conventional audio production tools.

Third, conventional audio production equipment is often bulky. Even when the tools used to process audio recordings are computer-implemented, other equipment involved in producing audio (e.g., sound production equipment like amplifiers, sound capture equipment like microphones, sound recording equipment, etc.) is often cumbersome. As a result, many users may find it inconvenient or impractical to use conventional audio production tools in certain (e.g., space-constrained) settings, and/or may be discouraged from producing audio at all if appropriate facilities are unavailable.

Fourth, functionality provided by conventional audio production tools is often more advanced than the average user needs or wants. As a result, the expense, time and bulkiness associated with sophisticated conventional audio production tools may not be worthwhile for many average users.

Some embodiments of the invention overcome these and other deficiencies to provide an audio production system that is less expensive, faster to set up, simpler and easier to use, and more portable than conventional audio production tools. An audio production system implemented in accordance with some embodiments of the invention may be more accessible to the typical user, and easier and more enjoyable to use, than conventional audio production tools.

In accordance with some embodiments of the invention, an audio production system comprises an audio controller that communicates with a mobile device. In some embodiments, the audio controller may have a relatively small form-factor, which makes it portable and easy to use in any of numerous settings. For example, in some embodiments, the audio controller may be small enough to fit in a backpack or a purse. The audio controller may include easy-to-use controls for acquiring, recording and playing back audio. Further, as described in detail below, an audio controller implemented in accordance with some embodiments may enable a user to quickly and easily create multiple tracks, stop and start recordings, discern that audio is being recorded at appropriate levels, and perform other audio production-related tasks.

In some embodiments, an audio controller and mobile device may communicate wirelessly, enabling various features of the mobile device to be employed to perform audio production tasks seamlessly. For example, the mobile device's graphical user interface may be used to present controls that a user may employ to process audio that is captured by the audio controller. The mobile device's graphical user interface may enable a user to mix, cut, filter, amplify, equalize or play back captured audio. Recorded tracks may, for example, be stored in the memory of the mobile device and be accessed for processing by a user at his/her convenience.

A graphical user interface of the mobile device may also, or alternatively, be used to provide visual feedback to a user while audio input is being captured by the audio controller, so that the user may gain confidence that audio being captured by the audio controller has any of numerous characteristics. For example, in some embodiments, the graphical user interface of the mobile device may display a waveform and/or other representation which visually represents to the user the gain level of the audio being captured by the audio controller, so that the user may be provided with visual feedback that the audio being captured by the audio controller has a suitable gain level. For example, the visual feedback may indicate that the gain level of the captured audio is within a suitable dynamic range, and/or has any other suitable characteristic(s).

In this respect, the Assignee has appreciated that the usefulness of such visual feedback is directly correlated to the visual feedback being presented to the user in real time or near real time (and indeed, that visual feedback which is delayed may confuse or frustrate the user). The Assignee has also appreciated, however, that wireless communication is commonly prone to delays and interruptions, particularly when large amounts of data are being transferred. As a result, some embodiments of the invention are directed to techniques for wireless communication between an audio controller and mobile device to enable visual feedback to be presented to the user in real time or near real time.

Given that a digitized version of captured audio may comprise large amounts of data, which may prove difficult to transmit from the audio controller to the mobile device in real time or near real time, some embodiments of the invention provide techniques for generating information that is useful for rendering a visual representation of captured audio, communicating this information to the mobile device in real time or near real time, and separately producing and later communicating a digitized version of the audio itself. As such, in some embodiments, data that is used to render a visual representation of an audio recording to the user via the mobile device may be decoupled from the digitized version of the audio, and transmitted separately from the digitized version of the audio to the mobile device, so that it may be delivered to the mobile device more quickly than the digitized version of the audio.

Such a transfer of information may be performed in any of numerous ways. In some embodiments, both the data useful for rendering the visual representation, and the digitized version of the audio recording, may be generated based on the same audio input, as it is captured by the audio controller. For example, in some embodiments, two distinct data sequences may be generated from captured audio. A first sequence, referred to herein as a "low-resolution (LR) sequence", may be generated by sampling a body of audio input at a first sampling rate. The sampling rate may, for example, be chosen so as to provide a sufficient number of data samples so that one or more representations (e.g., waveforms, bar meters, and/or any other suitable representations) may be rendered on the mobile device, but a small enough number of samples so that when each sample is sent to the mobile device, the transmission is unlikely to encounter delays due to latency or lack of bandwidth in the communication network. A second sequence, referred to herein as a "high-resolution (HR) sequence", may, for example, be generated by sampling the body of audio input at a second sampling rate which is greater than the first sampling rate. In some embodiments, the HR sequence may comprise a high-quality digitized version of the captured audio input which is suitable for playback and/or subsequent processing by the user. In some embodiments, the LR and HR sequences may be sent to the mobile device in a manner that enables the LR sequences to be received at the mobile device in real time or near real time, so that the visual representation of the captured audio may be rendered immediately, when the user finds it most useful. By contrast, the HR sequences may be received at the mobile device later, and indeed may not arrive at the mobile device until after the user stops recording audio with the audio controller, when the user is most likely to be ready to take on the task of playing back and/or processing the audio. Sending data useful for rendering the representation separately from the digitized version of captured audio may be accomplished in any of numerous ways, such as by assigning transmissions of LR sequences a higher priority than transmissions of HR sequences, by transmitting HR sequences less frequently than LR sequences, and/or using any other suitable technique(s). As a result, some embodiments of the invention may prevent the transmission of a digitized version of captured audio from interfering with the timely transmission of data useful for rendering a representation on the mobile device.

Some embodiments of the invention enable users to perform certain audio production tasks more easily than conventional audio production tools allow. As one example, some embodiments may enable a user to automatically map a new audio input to a new track. For example, when a new audio input is received, some embodiments of the invention may automatically create a new track for the input, and map the input to the new track. As such, users may avoid the manual, time-intensive process involved in creating a new track using conventional audio production tools.

As another example, some embodiments of the invention may provide controls that enable a user to more easily adjust the gain and pan levels of recorded audio than conventional audio production tools allow. (In this respect, the gain level for recorded audio generally characterizes the power level of a signal representing the recorded audio as compared to a predetermined level, and the pan level generally characterizes the amount of a signal representing the recorded audio that is sent to each of multiple (e.g., left and right) channels.) In some embodiments of the invention, the graphical user interface of the mobile device may enable a user to easily specify both the gain level and the pan level for recorded audio using a single control and/or via a single input operation. For example, in some embodiments, the user interface may include a touchscreen configured to receive gain/pan data for each track of a multi-track recording, via a cursor provided for each track. The touchscreen may, in some embodiments, represent the gain and pan levels for each track on an X-Y coordinate system, with the gain level represented on one of the X-axis and the Y-axis, and the pan level represented on the other of the two axes. By enabling a user to move a cursor up/down/left/right within the coordinate system shown on the touchscreen, some embodiments may provide for easy user adjustment of the gain and pan for tracks in a recording.

As another example, some embodiments of the invention may provide controls which enable a user to more easily perform a "sound check" for recorded audio than conventional audio production tools allow. In this respect, sound checks are conventionally performed in audio recording or live performance settings to make sure that the sound being produced at a sufficiently high gain level to enable it to be heard clearly, but at not such a high gain level that captured sound becomes distorted. Using conventional audio production tools, performing a sound check is a cumbersome process. For example, a user may play a portion of a music piece, check the gain level of the captured audio, adjust the gain level if it is not at the desired level, then play a portion of the music piece again, then re-check whether the gain level is appropriate, and so on until the right level is achieved. This is not only unnecessarily time-consuming, but can also be complicated and error-prone if some portions of the music piece are louder than others. Accordingly, some embodiments of the invention enable a user to perform a sound check routine automatically, such as in response to audio input being initially captured. For example, in some embodiments, when the user first begins creating sound, one or more components of the audio recording system may automatically detect one or more characteristics of the sound, and automatically adjust the gain level of captured audio so that it falls within a predetermined acceptable dynamic range.

It should be appreciated that the foregoing is a non-limiting overview of only certain aspects of the invention. Some embodiments of the invention are described in further detail in the sections that follow.

II. Audio Production System

Figure 1B:
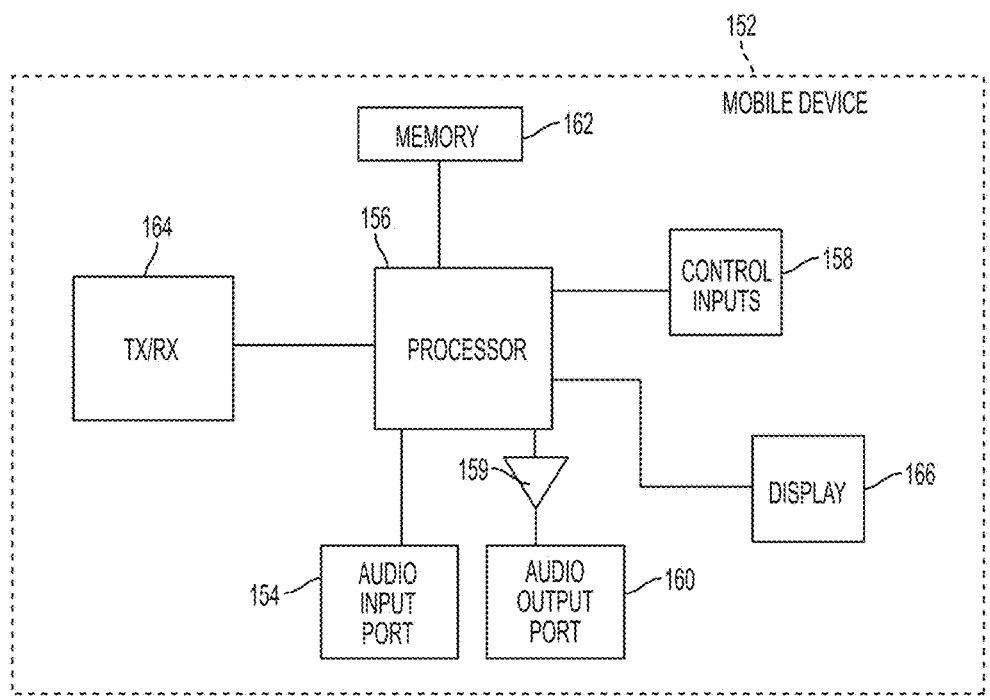
FIG. 1B is a block diagram illustrating a mobile device configured to operate as part of an audio recording system, according to some non-limiting embodiments.

FIGS. 1A-1B depict components of a representative audio recording system, according to some embodiments of the invention. In particular, FIG. 1A illustrates a representative audio controller 102 and FIG. 1B illustrates a representative mobile device 152. In the example shown, representative audio controller 102 comprises a plurality of audio input ports $104_1, 104_2 \ldots 104_N$, a processor 106, a memory 112, control inputs 108, amplifier 109, audio output port 110, transceiver 114, visual output unit 116, and power unit 118. The audio input ports $104_1, 104_2 \ldots 104_N$ may, for example, be connected to different audio sources, such as different instruments or microphones. Of course, some embodiments of the invention may not provide multiple audio input ports, as any suitable number may be provided. In some embodiments, easy access to one or more of the audio input ports may be provided by placing the audio input ports on the external housing of the audio controller.

In some embodiments, the audio controller may be equipped with a microphone, which may be connected to an audio input port. The microphone may, for example, reside within the audio controller's housing. Additionally, or alternatively, external microphones may be used. The audio input ports $104_1, 104_2 \ldots 104_N$ may receive audio inputs from one or more audio sources. An audio input may, for example, be time-delimited, such that it consists of sound captured during a particular time period. The time period may be fixed or variable, and be of any suitable length. Of course, an audio input need not be time-delimited, and may be delimited in any suitable fashion. For example, a user may cause the generation of a time-delimited audio input by creating audio during a certain time interval, such as between the time when the user actuates a "record" button and the time when the user actuates a "stop" button. The audio input(s) may be provided to processor 106. Processor 106 may be implemented using a microprocessor, a microcontroller, an application specific integrated circuit (ASIC), a field programmable gate array (FPGA), or any other suitable type of digital and/or analog circuitry. Processor 106 may be used to sample the audio inputs to digitize them. In addition, processor 106 may be configured to process the audio inputs in any suitable manner (e.g., to filter, equalize, amplify, or attenuate). For example, processor 106 may execute instructions to analyze the spectral content of audio input and determine whether such spectral content has a suitable distribution. Such instructions may, for example, produce a filter function aimed at filtering out certain spectral components of the audio input (e.g., providing a high-pass filter response, a low-pass filter response, a band-pass filter response and/or a stop-band filter response). Such instructions may also, or alternatively, balance the spectral content of the audio input by attenuating and/or amplifying certain spectral components with respect to others. For example, such instruction may be used to produce spectral equalization. Such instructions may also, or alternatively, analyze one or more levels of the audio input and determine the suitability of the level(s) for the desired recording/playback environment, and/or amplify or attenuate the level(s) if desired.

Processor 106 may be coupled to memory 112. Memory 112 may have any suitable size, and may be implemented using any suitable type of memory technology, including random access memory (RAM), read only memory (ROM), Flash memory, electrically erasable programmable read only memory (EEPROM), etc. Memory 112 may be configured to store audio inputs received through the audio input ports, and/or to store modified versions of the audio inputs. In some embodiments, as it will be described further below, a portion of memory 112 may be used to buffer data to be transmitted to mobile device 152.

Processor 106 may be coupled to audio output port 110. In some embodiments, processor 106 may be coupled to audio output port 110 through amplifier 109. Audio output port 110 may be connected to a sound emitting device, such as a speaker set or a headphone set. The speaker set may be integrated with audio controller 102. For example, the speaker may be mounted in the housing of audio controller 102. Alternatively, or additionally, the speaker may be external. Processor 106 may comprise circuitry for driving the audio emitting device connected to audio output port 110. For example, processor 106 may comprise a digital-to-analog converter. Amplifier 109 may be used to adjust the level of the audio output as desired.

Figure 2:
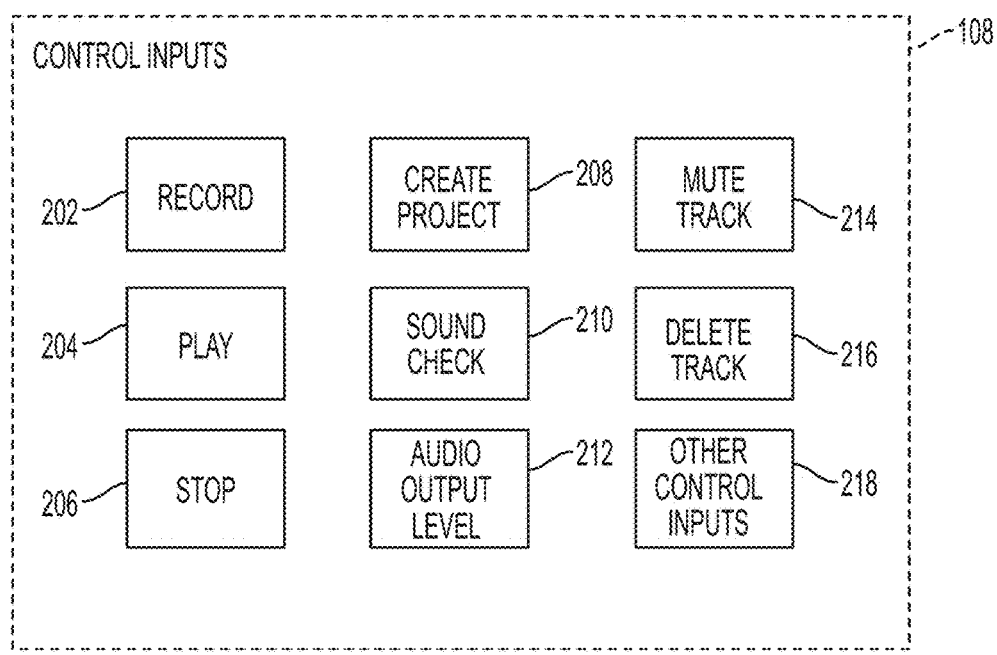
FIG. 2 is a block diagram illustrating control inputs of the audio controller of FIG. 1A, according to some non-limiting embodiments.

Processor 106 may be coupled to control inputs 108. Some representative control inputs 108 are shown in FIG. 2. Control inputs 108 may comprise any suitable user interface, including physical buttons, touch screen controls, and/or any other suitable control(s). It should be appreciated that control inputs 108 need not be manually actuated. For example, in some embodiments, control inputs 108 may be actuated via voice recognition.

In the example shown in FIG. 2, control inputs 108 comprise a "record" button 202. When the record button is actuated by a user, the audio controller 102 may begin to record an audio input. The record button may be configured to record any suitable number of audio inputs. In the example shown, control inputs 108 also comprise "play" button 204. When the play button is actuated by a user, the audio controller 102 may play a recorded audio input using audio output port 110, which may be connected to a speaker set or a headphone set. In the example shown, control inputs 108 may comprise a "stop" button 206. When the stop button is actuated by a user, the audio controller 102 may stop recording if recording is underway or stop playing if playing is underway. In the example shown, control inputs 108 comprises a "create project" button 208. When the create project button is actuated by a user, processor 106 may allocate a portion of memory 112 for a new project. The portion of the memory 112 may be populated with one or more audio inputs that are considered by the user as part of the same project.

In the example shown, control inputs 108 comprise a "sound check" button 210. When the sound check button is actuated by a user, the audio controller 102 may initiate a sound check routine. Sound check routines will be described further below. In the example shown, control inputs 108 comprise an "audio output level" button 212. The audio output level may be used to increase or decrease the level of the audio produced using audio output port 110. In the example shown, control inputs 108 comprise a "mute track" button 214. When the mute track button is actuated by a user, the audio controller 102 may mute a desired track, while playing of other tracks may continue. In this way, a user may toggle tracks on/off as desired. In the example shown, control inputs 108 comprise a "delete track" button 216. When the delete track button is actuated by a user, the audio controller 102 erase a track from memory 112. In the example shown, control inputs 108 may further comprise other control inputs 218 to provide any desired functionality, and/or may not include all of the control inputs 108 depicted in FIG. 2. Although a specific combination of control inputs is described above with reference to FIG. 2, any suitable combination of control inputs 108 may be provided.

Referring back to FIG. 1A, audio controller 102 may further comprise visual output unit 116. Visual output unit 116 may be configured to provide visual outputs in any suitable way. For example, visual output unit 116 may comprise an array of light emitting elements, such as light emitting diodes (LEDs), a display, such as a liquid crystal display (LCD), and/or any other suitable visual output component(s). In some embodiments, visual output unit 116 may light up in response to actuation of a button of control inputs 108, and/or in response to any other suitable form(s) of input. For example, visual output unit 116 may light up when a track is being recorded, or when the audio controller detects audio above a certain threshold. In some embodiments, visual output unit 116 may change lighting color in response to certain input being received. For example, a light-emitting element may be associated with a track, and may display one color when the track is being recorded and another color when the recording is paused. The visual output unit 116 may be used to provide any of numerous different types of visual feedback to the user. Of course, visual output unit 116 need not rely upon light or color to convey such information.

Audio controller 102 may further comprise transceiver (TX/RX) 114. Transceiver 114 may be a wireless transceiver in some embodiments, and may be configured to transmit and/or receive data to/from a mobile device, such as mobile device 152. Transceiver 114 may be configured to transmit/receive data using any suitable wireless communication protocol, whether now known or later developed, including but not limited to Wi-Fi, Bluetooth, ANT UWB, ZigBee, LTE, GPRS, UMTS, EDGE, HSPA+, WIMAX and Wireless USB. Transceiver 114 may comprise one or more antennas, such as a strip antenna or a patch antenna, and circuitry for modulating and demodulating signals. Audio controller 102 may further comprise a power unit 118. The power unit 118 may power some or all the components of audio controller 102, and may comprise one or more batteries.

FIG. 1B illustrates mobile device 152, according to some non-limiting embodiments. Mobile device 152 may comprise any suitable device(s), whether now known or later developed, including but not limited to a smartphone, a tablet, a smart watch or other wearable device, a laptop, a gaming device, a desktop computer, etc. In the example shown, mobile device 152 comprises transceiver (TX/RX) 164, processor 156, memory 162, audio input port 154, amplifier 159, audio output port 160, control inputs 158 and display 166. However, it should be appreciated that mobile device 152 may include any suitable collection of components, which may or may not include all of the components shown, Transceiver 164 may be configured to support any of the wireless protocols described in connection with transceiver 114, and/or other protocols. In some embodiments, transceiver 164 may receive signals, from transceiver 114, that are representative of audio inputs. The received signals may be processed in any suitable way using processor 156, and may be stored in memory 162. Control inputs 158 may comprise any suitable combinations of the inputs described in connection with FIG. 2. The inputs may be actuated using a touch screen display. Audio input port 154 may be connected to an audio source, such as a microphone or an instrument. The microphone may be integrated with the mobile device, and/or may be external. Audio output port 160 may be connected to a sound emitting device, such a speaker set or a headphone set. The speaker set may be embedded in the mobile device. Audio output port 160 may be used to play audio recordings obtained through audio input ports $104_1$, $104_2$ . . . $104_N$ or audio input port 154. In some embodiments, amplifier 159 may be used to set the audio output to a desired level. Display 166 may be used to display waveforms representative of recording audio inputs.

Audio controller 102 and mobile device 152 may communicate via their respective transceivers. In the preferred embodiment, audio controller 102 and mobile device 152 are configured to communicate wirelessly, but it should be appreciated that a wired connection may be used, in addition to or as an alternative to a wireless connection.

Figure 3:
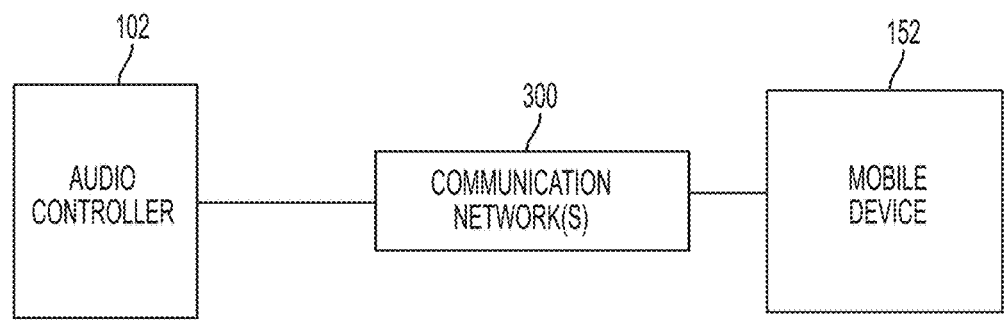
FIG. 3 is a block diagram illustrating an audio recording system and a communication network, according to some non-limiting embodiments.

In the example shown in FIG. 3, audio controller 102 and mobile device 152 communicate via communication network(s) 300. The communication network(s) 300 may employ any suitable communications infrastructure and/or protocol(s). For example, communication network 300 may comprise a Wi-Fi network, Bluetooth network, the Internet, any other suitable network(s), or any suitable combination thereof.

III. Mitigating Communication Delays to Provide a Visual Representation of Recorded Audio The Assignee has appreciated that the performance of communication network(s) 300 may be affected by the distance between transceivers 114 and 164, any noise or interference present in the environment in which communication network(s) 300 operates, and/or other factors. For example, in some circumstances, communication network 300 may not provide sufficient bandwidth for all communication needs, imposing an upper limit on the rate at which data can be transferred between audio controller 102 and mobile device 152. Accordingly, one aspect of the present invention relates to the manner in which data is communicated between audio controller 102 and mobile device 152.

Figure 4A:
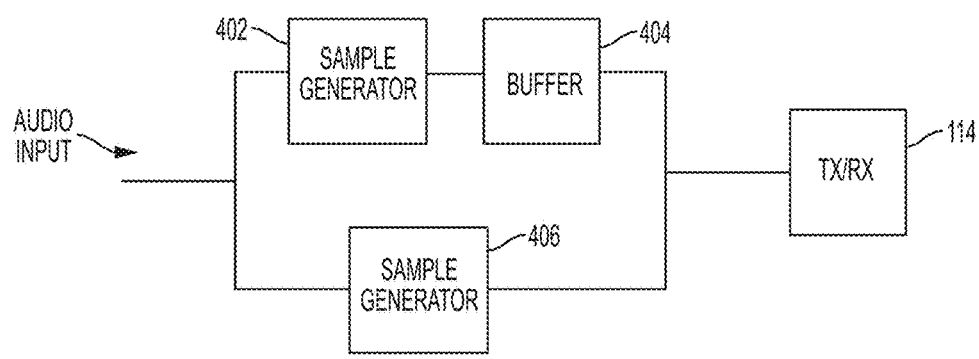
FIG. 4A is a block diagram illustrating how multiple sequences associated with an audio input may be generated, according to some non-limiting embodiments.

In accordance with some embodiments of the invention, a plurality of data sequences may be communicated between audio controller 102 and mobile device 152. For example, in some embodiments audio controller 102 may transmit, for a body of captured audio input, a low-resolution (LR) sequence and a high-resolution (HR) sequence representing the body of captured audio input to mobile device 152. While both the LR and HR sequence may be representative of the body of audio input captured through audio input ports $104_1$, $104_2$ . . . $104_N$, the way in which the sequences are generated and transmitted to mobile device 152 may differ. FIG. 4A is a block diagram illustrating how the sequences may be generated, according to some non-limiting embodiments of the invention.

In the example shown in FIG. 4A, the LR sequence is generated by sampling a body of audio input using sample generator 406 at a first sampling rate. Sample generator 406 may be implemented using processor 106 (FIG. 1A). The first sampling rate may be at any suitable frequency (e.g., between 10 Hz and 1 KHz, between 10 Hz and 100 Hz, between 10 Hz and 50 Hz, between 10 Hz and 30 Hz, between 10 Hz and 20 Hz, or between 20 Hz and 30 Hz). The LR sequence may be transmitted to mobile device 152 using transceiver 114. In some embodiments, the LR sequence may include data which is used to render a visual representation of captured audio to a user of the mobile device, and so the sampling rate may be chosen so the visual representation may be rendered in real time or near real time. As used herein, the term "near real time" indicates a delay of 50 ms or less, 30 ms or less, 20 ms or less, 10 ms or less, or 5 ms or less.

By contrast, an HR sequence may be generated by sampling the body of audio input with sample generator 402, which may also be implemented using processor 106 (FIG. 1A). The sample generator may, for example, sample the body of audio input at a second sampling rate which is greater than the first sampling rate. The second sampling rate may be configurable, and selected to provide a high-quality digitized version of the audio input. For example, the second sampling rate may be between 1 KHz and 100 KHz, between 1 KHz and 50 KHz, between 1 KHz and 20 KHz, between 10 KHz and 50 KHz, between 10 KHz and 30 KHz, between 10 KHz and 20 KHz, or within any suitable range within such ranges.

The body of audio input that is sampled to produce the LR and the HR sequences may be delimited in any suitable way. For example, it may be time-delimited (e.g., representing an amount of audio captured by the audio controller over an amount of time), data-delimited (e.g., representing captured audio comprising an amount of data), and/or delimited in any other suitable fashion.

In some embodiments, the HR sequence may be temporarily stored prior to transmission in a buffer 404, which may be implemented using memory 112, a virtual data buffer, and/or any other suitable storage mechanism(s). In this respect, the Assignee has appreciated that due to the rate at which audio input is sampled to produce an HR sequence, the amount of bandwidth needed to transmit the data in the HR sequence may exceed the available bandwidth of communication network(s) 300. By temporarily storing HR sequence data in buffer 404 prior to transmission, some embodiments of the invention may throttle transmissions across communication network(s) 300, so that sufficient bandwidth is available to transmit LR sequence data on a timely basis. That is, through the use of buffer 404, HR sequences may be segmented into bursts for transmission. In some embodiments, first-in first-out (FIFO) schemes may be used, that is, data is output out of the buffer 404 in the order it is received. However, it should be appreciated that other schemes may also, or alternatively, be used.

In some embodiments, HR sequence data may be held in buffer 404 until it is determined that the buffer stores a predetermined amount of data (e.g., 1 KB, 16 KB, 32 KB, 128 KB, 512 KB, 1 MB, 16 MB, 32 MB, 128 MB, 512 MB or any suitable value between such values), or when the amount of memory allocated to the buffer is completely populated. The amount of memory allocated to buffer 404 may be fixed or variable. If variable, the size may be varied to accomplish any of numerous objectives.

Of course, the invention is not limited to transmitting HR sequence data when the buffer stores a predetermined amount of data. For example, in some embodiments, HR sequence data may be transmitted when it is determined that communication network(s) 300 have enough bandwidth to support transmission of HR sequence data. In some embodiments, HR sequence data may be transmitted when a "stop recording" command is received at the audio controller. Any suitable technique(s) may be used, as the invention is not limited in this respect.

Figure 4B:
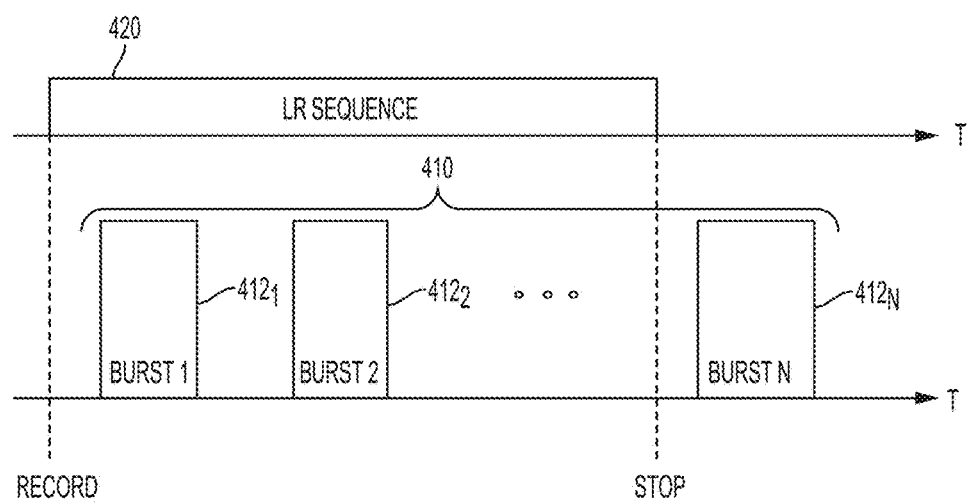
FIG. 4B is a schematic diagram illustrating transmissions of data sequences using the communication network of FIG. 3, according to some non-limiting embodiments.

FIG. 4B depicts the transmission of LR and the HR sequence data via communication network(s) 300. In particular, exemplary LR sequences 420 and HR sequences 410 are shown. In the example depicted, multiple discrete LR sequences are transmitted serially during the time period depicted, and thus are depicted as a continuous transmission 420 in FIG. 4B for simplicity. Of course, it should be appreciated that transmissions of LR sequence data may not be performed serially, and that transmissions may be separated by any suitable time interval(s). It should also be appreciated that although FIG. 4B depicts LR sequences being transmitted from the time when recording begins (or shortly thereafter) to the time when recording stops (or shortly thereafter), the invention is not limited to being implemented in this manner, as transmission may start and end at any suitable point(s) in time. Transmission of LR sequences may be performed using any suitable technique(s), including but not limited to ZeroMQ.

In the example shown in FIG. 4B, transmission of HR sequences 410 is performed in multiple bursts, designated $412_1$, $412_2$ . . . $412_N$. Some or all the bursts may, for example, be transmitted after recording of audio by the audio controller ends.

Figure 5A:
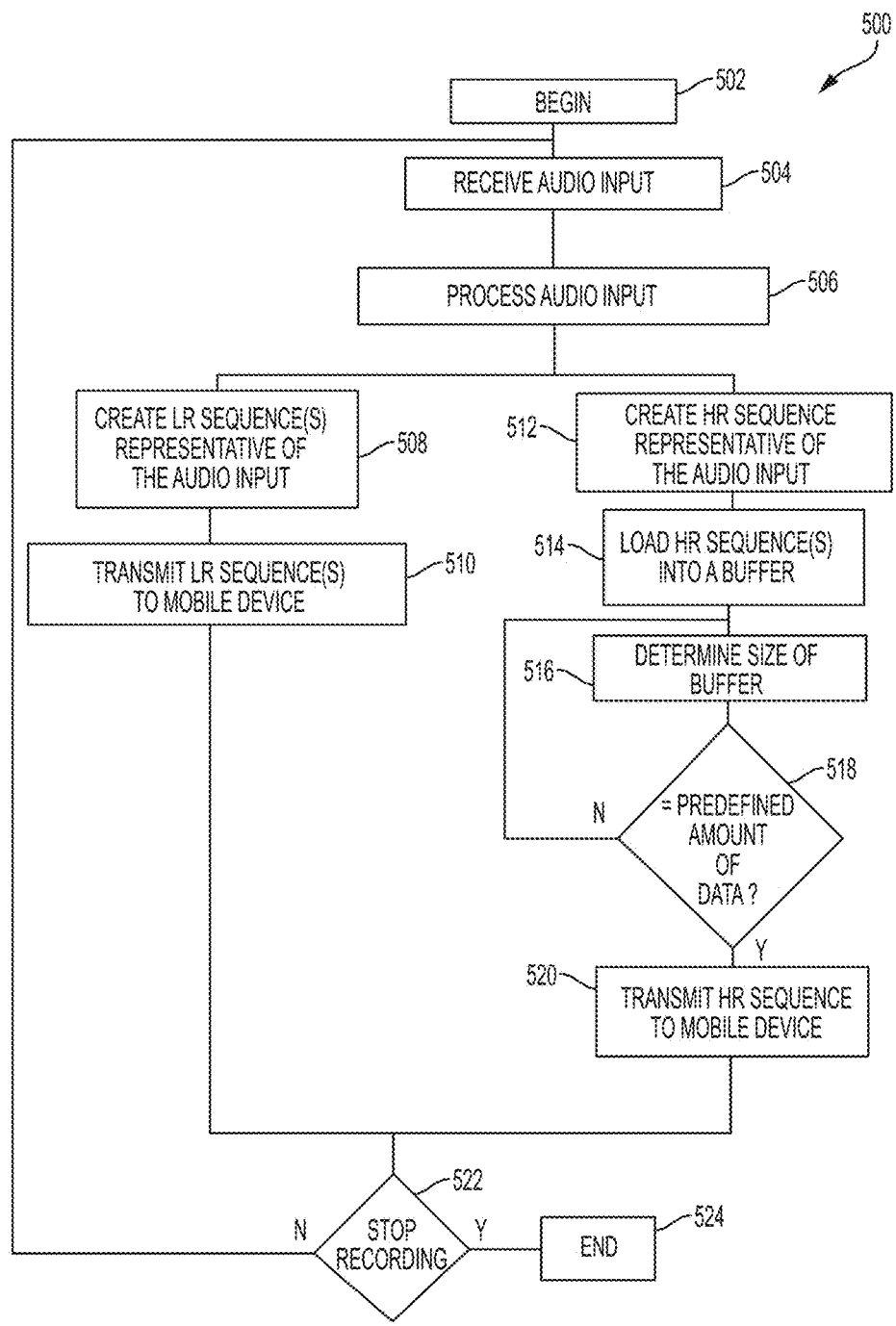
FIG. 5A is a flowchart illustrating a method for transmitting an audio input to a mobile device, according to some non-limiting embodiments.

FIG. 5A depicts a representative method 500 for transmitting audio input to a mobile device, according to some embodiments of the invention. Method 500 begins at 502. In act 504, a body of audio input is received using an audio controller. The audio controller may receive the body of audio input, for example, through one or more audio input ports.

Method 500 then proceeds to act 506, wherein the audio input is processed, in any suitable way. For example, the audio input may be filtered, equalized, distorted, etc. Then, in act 508, one or more LR sequences are created based on the audio input. Each LR sequence may be generated by sampling the audio input(s) at a first sampling rate. In some embodiments, the LR sequence(s) may be compressed, using any suitable compression technique(s) and compression ratio(s) (e.g., 2:1, 4:1, 16:1, 32:1, or within any range between such values). For example, a free lossless audio codec (FLAC) format for compressing the LR sequence(s) may be used. Each LR sequence is then transmitted to a mobile device in act 510. In some embodiments, such transmission is wireless.

In act 512, one or more HR sequences are created by sampling the audio input(s) at a second sampling rate which is greater than the first sampling rate. As with the LR sequence(s), each HR sequence may be compressed, using any suitable compression technique (e.g., FLAC) and/or compression ratio(s). In act 514, the HR sequences are loaded into a buffer.

In act 516, the amount of data in the buffer is determined, and the method then proceeds to act 518, wherein a determination is made whether the amount of data stored in the buffer exceeds a predefined amount of data. If it is determined in the act 518 that the amount of data stored in the buffer does not exceed a predefine amount of data, then method 500 returns to 516 and proceeds as described above.

However, if it is determined in act 518 that the amount of data stored in the buffer exceeds a predefined amount of data, then method 500 proceeds to act 520, wherein the data comprising one or more HR sequences is transmitted to the mobile device.

HR sequence data may be transmitted in any suitable fashion. For example, as noted above, in some embodiments HR sequence data may be transmitted in bursts. That is, HR sequence data may be partitioned into multiple segments, and each segment may be transmitted to the mobile device at a different time.

The partitioning of HR sequence data may be accomplished in any of numerous ways. As one example, a burst may be transmitted when the buffer stores a predefined amount of data. As another example, a burst may be transmitted after an amount of time passes after HR sequence data was first loaded to the buffer (e.g., less than 1 ms, less than 10 ms, less than 100 ms, less than 1 s, or less than 10 s after HR sequence data is first loaded to the buffer).

The size of HR sequence data bursts may be fixed or variable. If variable, the size may be chosen depending on any suitable factor(s), such as a comparison between the rate at which HR sequence data is loaded to the buffer and the rate at which HR sequence data is transmitted.

The bursts may, for example, be transmitted one at a time. That is, a first burst may be transmitted during a first time interval, and a second burst may be transmitted during a second time interval different from the first time interval. The first and second time intervals may be separated by any suitable amount of time or may be contiguous. Of course, the invention is not limited to such an implementation, as bursts may be transmitted simultaneously, or during overlapping time intervals.

In some embodiments, processor 106 may create each burst to include a payload and one or more fields describing the content of the burst. The payload may include data which represents a body of captured audio input. The field(s) may, for example, indicate that the burst includes HR sequence data, the placement of the burst among other HR sequence data, and/or other information. The field(s) may, for example, be appended to the payload (e.g., as a header).

Act 520 may, in some embodiments, include deleting transmitted data from the buffer.

Process 500 then proceeds to act 522, wherein a determination is made whether a stop recording command has been received. If it is determined that a stop recording command has not been received, then method 500 returns to act 504, and proceeds to process additional audio input as described above. If, however, it is determined that a stop recording command has been received, then method 500 completes.

It should be appreciated that although representative process 500 includes generating an LR sequence and an HR sequence from the same body of audio input, the invention is not limited to such an implementation. Each LR sequence and HR sequence may represent any suitable portion(s) of captured audio input.

It should also be appreciated that any of numerous variations on method 500 may be employed. For example, some variations may not include all of the acts described above, some may include acts not described above, and some may involve acts being performed in a different sequence than that which is described above. It should further be appreciated that in some embodiments, certain of the acts described above may be performed in parallel, rather than serially as described above. For example, acts 508 and 510 may be performed to create and transmit one or more LR sequences from a body of audio input as acts 512-520 are performed to create and transmit one or more HR sequences from the same body of audio input.

Figure 5B:
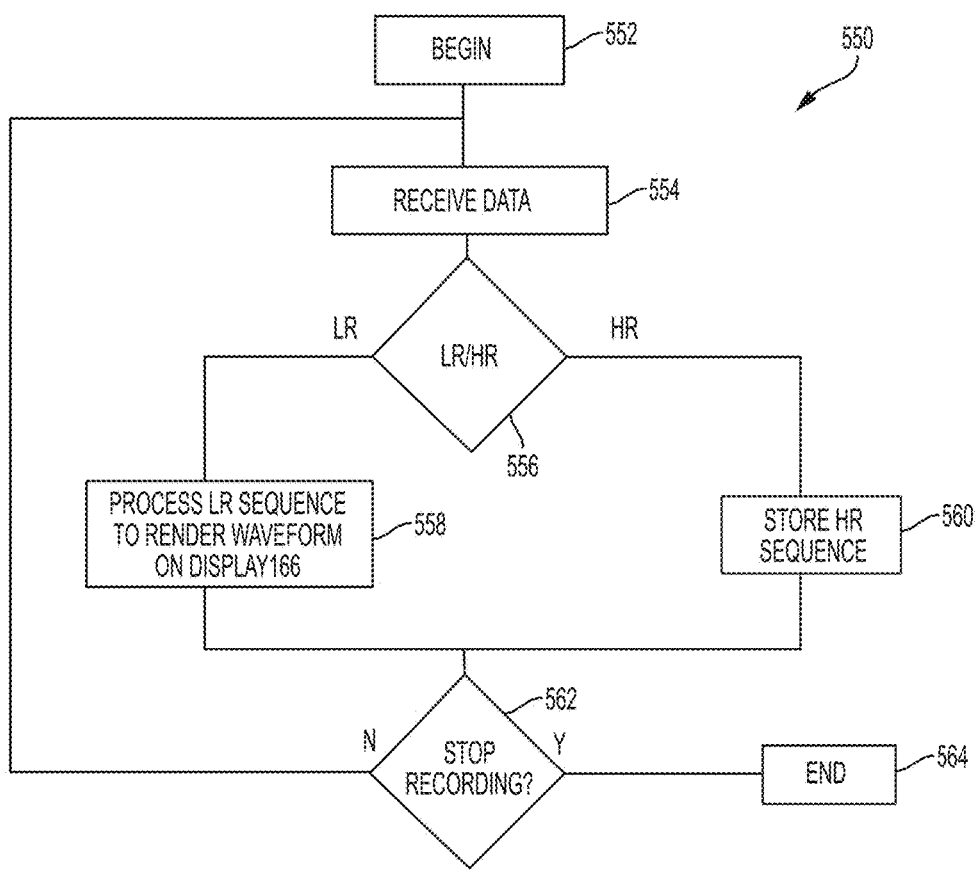
FIG. 5B is a flowchart illustrating a method for receiving an audio input with a mobile device, according to some non-limiting embodiments.

FIG. 5B depicts a representative method 550, which a mobile device may perform to receive audio input(s). Method 550 begins at 552. In act 554, the mobile device receives data transmitted by an audio controller via one or more communication networks. In the act 556, a determination is made whether the received data comprises LR sequence data or HR sequence data. This determination may be made in any of numerous ways. For example, the received data may include a header or field(s) comprising information indicating what type of data it represents.

If it is determined in the act 556 that the data received comprises LR sequence data, process 550 proceeds to act 558, wherein the LR sequence data is processed by the mobile device, such as to render a representation of captured audio input on display 166. The representation may, for example, provide visual feedback on one or more characteristics of the audio input to the user of the mobile device.

If it is determined in the act 556 that the data received in the act 554 comprises HR sequence data, then process 550 proceeds to act 560, wherein the HR sequence data is stored in a memory of the mobile device.

At the completion of either of act 558 or 560, process 550 proceeds to act 562, wherein a determination is made whether recording of audio input by the audio controller has stopped. This determination may be made in any of numerous ways. For example, the audio controller may provide to the mobile device an explicit indication that recording has ceased.

If it is determined in the act 562 that recording has not stopped, then process 550 returns to act 554, and repeats as described above. If it is determined in the act 562 that recording has stopped, then process 550 completes, as indicated at 564.

A representation of captured audio input produced by a mobile device based upon LR sequence data may take any of numerous forms. As but one example, a representation may comprise a waveform. Such a waveform may, for example, indicate the gain level, and/or any other suitable characteristic(s), of the captured audio input. By viewing a rendered representation, the user may determine whether captured audio has any of numerous desired characteristics, and thus that audio is captured and recorded in the manner desired and expected.

FIG. 6A is a schematic diagram of a mobile device during reception of LR sequence data. In the example shown, LR sequence data 420 is received using transceiver 164 and processed using processor 156. In some embodiments, processor 156 may generate a representation of audio input based upon LR sequence data 420 for rendering on display 166. For example, processor 156 may execute one or more instructions for mapping samples included in the LR sequence data to corresponding locations on the display of the mobile device. The locations may, for example, correspond to the gain level reflected in different LR sequences. For example, a gain level for a LR sequence may be reflected as a location along an axis included in a coordinate system shown on the display (e.g., a vertical axis), such that the higher the gain level, the higher the location on the axis. As LR sequences representing consecutive portions of the audio input are processed, the result is a waveform representation of the captured audio input's gain level.

FIG. 6B illustrates an example of a waveform. In particular, waveform 670 is displayed on display 666 of mobile device 652. (In the example shown, display 666 serves as display 166, and mobile device 652 serves as mobile device 152.) Waveform 670 provides a real time (or near real time) visual representation of the gain level of captured audio input. Of course, it should be appreciated that more than one waveform may be rendered on the display of the mobile device, with each waveform representing a different characteristic of captured audio, each waveform representing different audio inputs (e.g., different tracks of a recording), and/or any other suitable information.

It should also be appreciated that the invention is not limited to employing one or more waveforms to represent characteristics of captured audio, as any suitable representation(s) may be used. As but one example, a meter may be used to represent the gain level (and/or any other suitable characteristic(s)) of captured audio. The invention is not limited to using any particular type(s) of representation.

As noted above, HR sequence data comprising a digitized version of captured audio may be received by a mobile device, such as during the same time period as LR sequence data is received. In some embodiments, as HR sequence data is received, it may be stored in a memory of the mobile device, to accommodate subsequent playback and/or processing. FIG. 6C is a schematic diagram of a mobile device during reception of HR sequence data $412_1$-$412_n$. In some embodiments, if HR sequence data is received in a different order than the order in which it was transmitted, processor 164 may re-order the sequences so as to recompose the audio input. For example, processor 164 may execute a sorting routine to sort the received data. This may be performed in any of numerous ways, such as by using a value (e.g., provided in a header) indicating a sequence's placement among other sequences. The recomposed audio input may be stored in memory 162.

In some embodiments, the mobile device may play back captured audio once it is received from the audio controller in its entirety. For example, mobile device 152 (FIG. 1B) may reproduce received audio using audio output port 160, such as in response to user commands.

In some embodiments, the received audio may be processed by a user, in any of numerous ways, such as to produce a desired acoustic effect. For example, the user may perform filtering, equalization, amplification, and/or noise compensation on received audio. A software application installed on the mobile device may provide functionality for processing received audio, and a user interface for accessing the functionality. The user interface may, for example, include a waveform panel for displaying waveforms representing captured audio.

FIG. 7A-7B illustrate schematically a waveform panel 700 in a "record mode" and in a "play mode", respectively. In the record mode, the waveform panel may be configured to display a waveform corresponding to captured audio, as the audio input is being recorded. In the example shown in FIG. 7A, a waveform 704 is displayed. Progress bar 706 indicates the time elapsed since the beginning of the recording. In some embodiments the software application installed on the mobile device may automatically scale the waveform along the horizontal axis, so as to display the entirety of the body of captured audio in the waveform panel FIG. 7B illustrates the waveform panel 700 in the play mode. In the illustrated example, waveform 714 represents a previously recorded audio input. As the waveform is displayed, the mobile device may simultaneously play the previously recorded audio input using audio output port 160. Progress bar 716 indicates the time elapsed since the beginning of the audio input. Pause button 722 may be used to pause the play session. Record button 720 may be used to switch to the record mode.

IV. User Controls

A. Gain and Pan Adjustment

According to another aspect of the present invention, the software application may enable a user to set the gain and pan for captured audio, such as for each track in a multi-track recording. As noted above, the gain level for captured audio generally characterizes the power level of a signal representing the audio as compared to a predetermined level, and the pan level for captured audio generally characterizes the amount of a signal representing the audio that is sent to each of multiple (e.g., left and right) channels. By adjusting the gain and the pan for each track in a multi-track recording, a user may acoustically create the illusion that the sound captured in each track was produced from a different physical location relative to the listener. For example, a user may create the illusion that a guitar in one track is being played close to the listener and on the listener's right hand side. To do so, the user may increase the gain level (thereby indicating to the listener that the guitar is close by) and set the pan to the listener's right hand side The user may also create the illusion that a bass guitar in another track is being played farther away from the listener and on the listener's left hand side. To do so, the user may decrease the gain (thereby indicating to the user that the bass guitar is further away than the guitar) and set the pan to the listener's left hand side.

In some embodiments, gain and pan settings for individual tracks may be set using a touch panel on a graphical user interface of a mobile device. In some embodiments, the touch panel may represent gain and pan levels for each track on an X-Y coordinate system, with the gain level represented on one of the X-axis and the Y-axis, and the pan level represented on the other of the X-axis and the Y-axis. By moving a cursor up and down and left and right within the coordinate system shown, the user may adjust the gain and the pan for a track. FIG. 8A illustrates an example. Mobile device 852, which may serve as mobile device 152, may be configured to render touch panel 830. In some embodiments, the touch panel 830 may render an X-Y coordinate system. The touch panel may display one or more gain/pan cursors, which in the non-limiting example shown in FIG. 8A are labeled "1", "2", "3", "4", "5", "6", "7", and "8". In the example shown, the gain/pan cursors are displayed as circles. However, it should be appreciated that any other suitable shape may be used for the gain/pan cursors. Each gain/pan cursor may be associated with a track, and may represent a point within the gain/pan coordinate system. For each recorded track, a user may enter a desired gain/pan combination by moving the corresponding gain/pan cursor within the touch panel. For example, the user may touch, with a finger, an area of the touch panel that includes a gain/pan cursor, and move the gain/pan cursor up/down and/or left/right. In the example sown, moving a gain/pan cursor up/down along the Y-axis causes an increase/decrease in the gain of the corresponding track, while moving a gain/pan cursor left/right along the X-axis causes the pan of the track to be shifted toward the left/right channel. It should be appreciated that gain and pan may be adjusted by moving a gain/pan cursor in other ways.

While FIG. 8A illustrates a method for entering a gain/pan combination using a touch panel, the application is not limited in this respect and other methods may be used. For example, a gain/pan combination may be selected by entering values in a table, by vocally instructing a software application, or by using a control device (e.g., a mouse or keyboard). A table stored in memory 162 may keep track of the gain/pan cursors selected by the user. FIG. 8B illustrates an example of such a table. For each track 1 . . . 8, the table includes a first value representing the selected gain and a second value representing the selected pan. The values illustrated in the table are expressed in arbitrary unit, but any suitable unit may be used. The selected values may be used to control the manner in which the recorded tracks are played. The gain value may be used to set the gain of an amplifier, and the pan value may be used to set the balance between the audio channels. In some embodiments, a stereo sound system may be used. An example of a stereo sound system is illustrated in FIG. 8C. In the example shown, the stereo sound system 800 comprises a control unit 820, amplifiers 822 and 824, and sound emitting devices 826 and 828 (labeled "L" and "R" for left and right). However, it should be appreciated that different configurations may be used. For example, more than two channels may be used. The control unit 820 may be implemented using processor 106 or processor 156. Amplifiers 822 and 824 may be implemented using amplifier 109 or amplifier 159. The sound emitting devices 826 and 828 may be connected to the amplifier via audio output port 110 or audio output port 160. For each track, based on the selected gain/pan values, control unit 820 may set the gain of the amplifiers 822 and 824. For example, the sum (or the product) of the gains of amplifiers 822 and 824 may be based on the gain value, and the ratio (or the difference) of the gains of amplifiers 822 and 824 may be based on the pan value. However, other methods may be used.

Figure 8D:
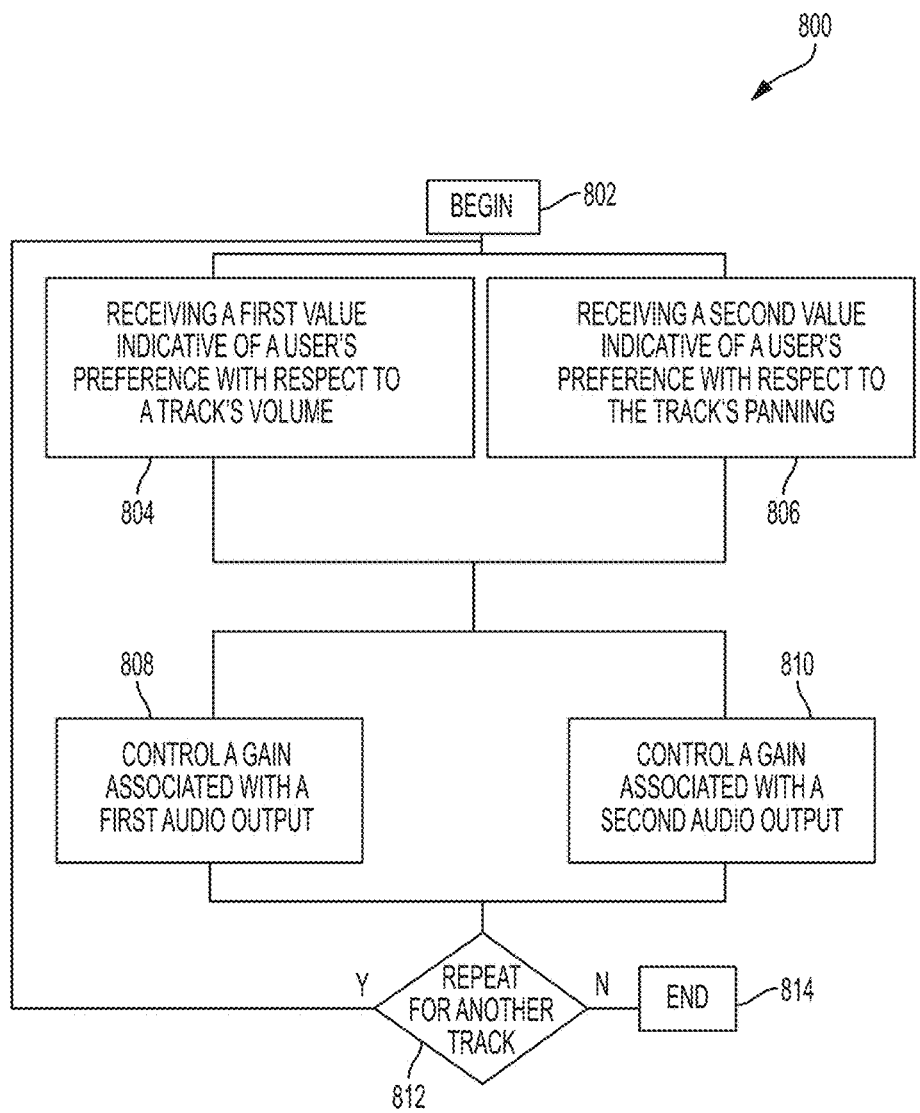
FIG. 8D is a flowchart illustrating a method for adjusting gain and pan, according to some non-limiting embodiments.

FIG. 8D is a flowchart illustrating a representative method 801 for adjusting gain and pan for a track, according to some non-limiting embodiments. Method 801 begins at 802. In act 804, a first value indicative of a user's preference with respect to a track's volume is received. In some embodiments, the first value may be entered by a user by moving a single cursor representing both gain and pan "up" and "down" within a coordinate system depicted in a touch panel. At act 806, a second value indicative of a user's preference with respect to the track's pan may be received. In some embodiments, the second value may be entered by a user by moving the cursor "left" and "right" within the coordinate system depicted by the touch panel. At act 808, based on the received gain and pan values, the gain of a first amplifier may be controlled. The first amplifier may be connected to a first sound-emitting device. At act 810, based on the received gain and pan values, the gain of a second amplifier may be controlled. The second amplifier may be connected to a second sound-emitting device. The first and second sound emitting devices may collectively form a stereo sound system. At act 812, it is determined whether additional gain/values are received. If no additional values are received, method 801 may end at act 814. If additional values are received, method 801 may repeat another track.

In some embodiments, the first value and the second value may be entered by a user using a single input device, such as the user's finger, a stylus or any other suitable implement.

B. Sound Check

Sound checks are often performed to make sure that sound is produced clearly and at the right volume. Manual sound checks are performed by sound engineers or musicians by playing a portion of an audio piece and by determining whether the volume of the audio is acceptable. If it is not, the sound engineer or musician may readjust the level of an amplifier and re-play a portion of an audio piece. If the volume is still not acceptable, another iteration may be performed. This method may be cumbersome, as multiple iterations may be needed before the desired condition is reached. The Assignee has appreciated that a sound check may be performed automatically using an audio recording system of the type described herein. In automatic sound checks, gain may be adjusted using electronic circuits as the audio input is being acquired. In this way, the sound check may be performed automatically without having to interrupt the musician's performance. According to one aspect of the present invention, automatic sound checks may be performed using audio controller 102 and/or mobile device 152. In some embodiments, a sound check may be performed during a dedicated audio recording session, which will be referred to herein as a "sound check routine", which typically takes place before an actual recording session. However, the application is not limited in this respect and sound checks may be an actual recording session. In this way, if there are variations in the recording environment (e.g., if a crowd fills the recording venue), or if there are variations in the characteristics of the audio being recorded (e.g., a single music piece includes multiple music genres), the recording parameters (e.g., gain) may be adjusted dynamically.

FIG. 9A is a schematic view illustrating a mobile device 901 during a sound check routine. Mobile device 901 may serve as mobile device 152. Mobile device 901 may initiate a sound check routine in response to receiving a user request. In some embodiments, such a request may be entered by a user by initiating a sound check button key, such as sound check button 210. In some embodiments, sound check button 210 may be disposed on the top side of the housing of audio controller 102. Positioning sound button 210 on the top side of the housing may provide easy reach to the user.

In some embodiments, the sound check routine may comprise a "checking levels" phase, in which levels of the audio input are detected; a "detecting silence" phase, in which a silence level is detected; and an "adjusting gain" phase, in which a gain is adjusted. Such routine may take a few seconds (e.g., less than 30 seconds, less than 20 seconds or less than 10 seconds). FIG. 9B illustrates schematically an audio input 900, which may be used during a sound check routine. Audio input 900 may be received through an audio controller or through an audio input port of the mobile device. In the checking levels phase, one or more levels of the audio input may be detected by a processor. For example, the average level 904 of audio input 900 may be detected between a time $t_1$ and a time t2. The average level may be computed in any suitable way, including an arithmetic mean, a geometric mean, a root mean square, etc. In some embodiments, a moving average may be computed. Accordingly, the average level may be computed during periodic intervals. The durations of the time intervals may be between 1 second and 100 seconds, between 1 second and 50 seconds, between 1 second and 20 seconds, between 1 second and 10 seconds, between 5 second and 10 seconds, between 10 second and 20 seconds, or within any range within such ranges. In this way, if the audio input varies its characteristics over time, the average level may be adjusted accordingly.

In some embodiments, a peak level 906, corresponding to the intensity of a peak 911, may be detected. In the detecting silence phase, a silence level 902 may be detected. During this phase, the mobile device may prompt the user to stop playing. In this way, the mobile device may detect the level received when no audio is played. The silence level may be limited by the background noise. In the adjusting gain phase, the gain of an amplifier, such as amplifier 159, may be adjusted based on the levels detected in the checking levels and the detecting silence phases. The gain may be adjusted so as to allow the audio output to vary within the dynamic range of the audio output system.

In some circumstances, the dynamic range of the audio system may be limited by the amplifier, while in other circumstances, it may be limited by the sound emitting device. FIG. 9C illustrates output audio 960 obtained by amplifying audio input 900. The dynamic range of the audio output system may be bound by a lower level 918 and by an upper level 924. In some embodiments, the dynamic range may be defined as the region in which the response of the audio output system, which includes amplifier 109 and a sound-emitting device, is linear. In other embodiments, the dynamic range may be defined as the region in which harmonic distortion is less than 10%, less than 5%, less than 3%, less than 2%, or less than 1%. The gain of the amplifier may be selected such that output audio 960 is within the dynamic range of the audio output system. In some embodiments, the silence level of the audio input 900 may be set to correspond to the lower level 918 of the dynamic range.

In some embodiments, a "headroom" region may be provided within the dynamic range. The headroom region may provide sufficient room for sound having a peak level to be played without creating distortion. The headroom region may be confined between upper level 924 and a headroom level 922. In some embodiments, headroom level 922 may be set at the level of the maximum of the audio input (e.g., level 906). The headroom may occupy any suitable portion of the dynamic range, such as 30% or less, 25% or less, 20% or less, 15% or less, 10% or less, or 5% or less. Choosing the size of the headroom may be based on trade-off considerations between providing enough room for peaks and limiting noise.

The examples of FIGS. 9A-9C illustrate sound check routines performed using a mobile device. Alternatively, a sound check routine may be performed using audio controller 102. In this embodiment, processor 106 may detect the levels of an audio input received though an audio input port, and may adjust the gain of amplifier 109. The detection and the gain adjustment may be performed in the manner described in connection with FIGS. 9B-9C.

Figure 9D:
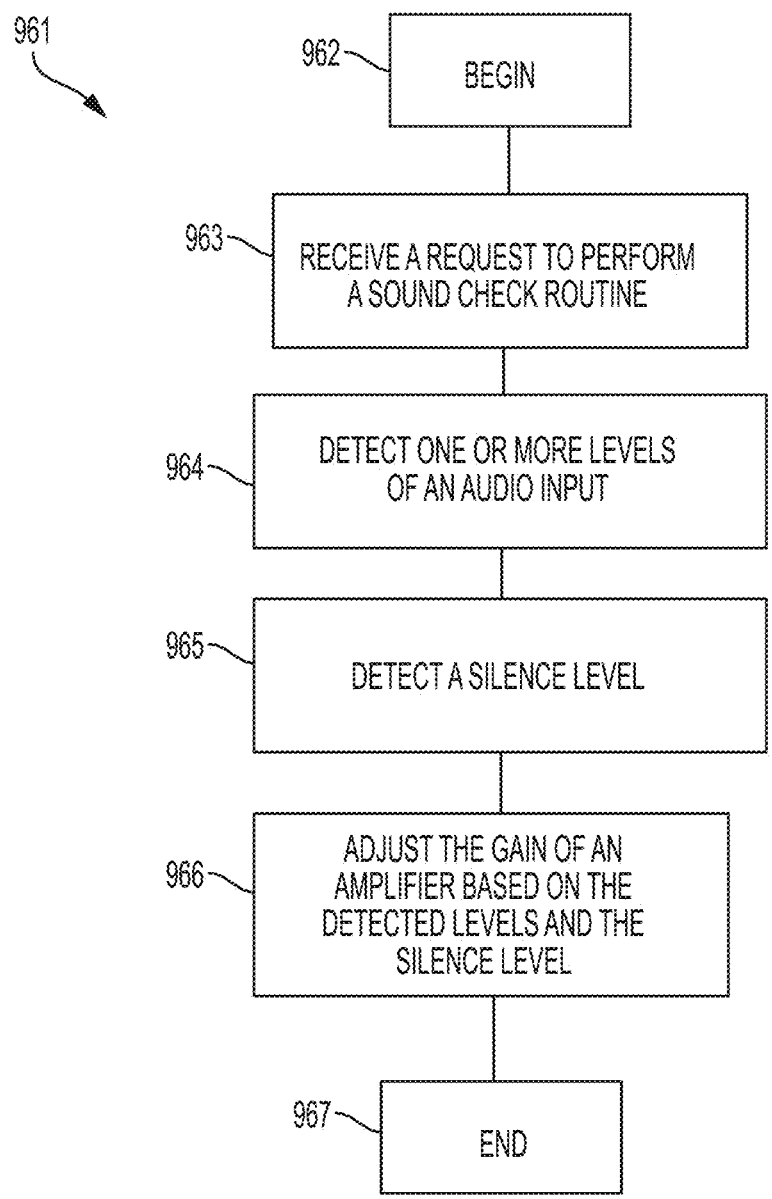
FIG. 9D is a flowchart illustrating a method for performing a sound check routine, according to some non-limiting embodiments.

FIG. 9D illustrates a representative method 961 for performing a sound check routine, according to some non-limiting embodiments. Method 961 begins at 962. In act 963, a request to perform a sound check routine is received. A user may request to perform a sound check routine by actuating sound check button 210 on the audio controller 102, or through a user interface on mobile device 152. At act 964, an audio input is received and one or more levels of the audio input are detected. The audio may be received using an audio input port of audio controller 102 or an audio input port of mobile device 152. Detection of the level(s) may be performed using processor 106 or 156. In some embodiments, the average level of the audio input may be detected. In some embodiments, the levels of one or more peaks may be detected.

In act 954, a silence level is detected. The silence level may be detected when no audio input is received. At act 966, the gain of an amplifier, such as amplifier 109 or 159, may be adjusted based on the level(s) detected at act 964 and the silence level detected at act 965. The gain is then adjusted in the act 966 so as to allow the audio output to vary within the dynamic range of the audio output system. In some embodiments, headroom may be provided within the dynamic range. The headroom may provide sufficient room for peaks to be played without significant distortion. Method 961 then completes.

The sound check routines described above are examples of automatic adjustment of the gain level of audio captured by an audio recording system. However, it should be appreciated that other (e.g., manual or semi-automatic) types of routines may be executed to adjust any of numerous audio characteristics.

For example, automatic gain adjustment of multiple amplification stages may be provided in some embodiments. In some embodiments, it may be desirable to amplify an audio input with a first amplifier located within the audio controller and with a second amplifier located within the mobile device. In some embodiments, a user may enter a desired amplification level, for example using the touchscreen of mobile device 152 or by actuating audio output level 212, and in response the gain of the amplifier located within the audio controller and the gain of the amplifier located within the mobile device may be set. In this way, a single entry may allow a user to set multiple gains. In contrast, in some conventional audio systems that include more than one amplification stage, a user may have to manually adjust the gain of each amplification until the desired audio quality is obtained. This operation may be cumbersome as it may take multiple iterations. In some embodiments, however, the user may set the gain of the two amplification stages with a single entry. When the desired gain level is provided by a user, processor 106 and/or processor 156 may adjust the gain of the two amplification stages to provide a certain sound quality. For example, the processor(s) may automatically adjust such gains until the noise level is below a certain value.

Figure 10:
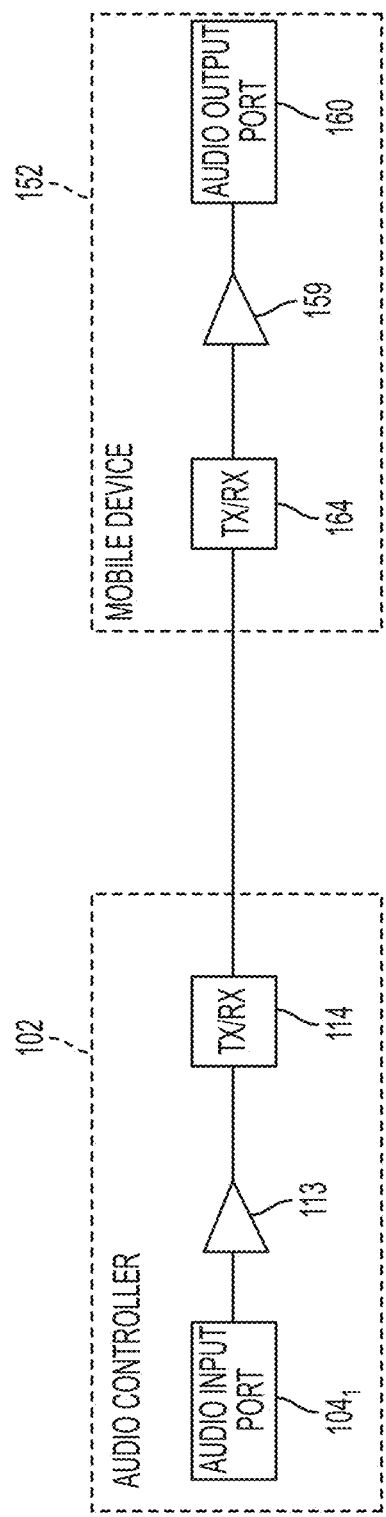
FIG. 10 is a block diagram illustrating an audio recording system having a plurality of amplification stages, according to some non-limiting embodiments.

In some embodiments, to limit noise, the gain of the first and second amplifiers may be set to match one another. FIG. 10 shows a block diagram illustrating a data path including a plurality of amplification stages. As illustrated, audio controller 102 may receive an audio input via audio input port 1041, may amplify the received signal with amplifier 113, and may transmit the amplified signal to mobile device 152 using transceiver 114. The transmitted signal may be received using transceiver 164, may be amplified using amplifier 159, and may be played using a sound emitting device (not shown in FIG. 10) connected to audio output port 160. In some embodiments, the gain of amplifier 113 may be set to be substantially equal (e.g., between 99% and 101%, between 95% and 105%, between 90% and 110%, between 80% and 120%, or between 75% and 125%) to the gain of amplifier 159. In this way, noise may be limited.

In another example, a certain characteristic of an audio recording system may be adjusted in response to detecting what type of audio source has been connected to an audio input port. For example, the audio recording system may recognize whether a microphone or an instrument has been plugged in, and/or what type of instrument has been plugged in. Any suitable technique for recognized the type of audio source may be used. For example, recognition of audio sources may be performed using machine learning techniques. Accordingly, the audio recording system may be trained to recognize certain patterns associated with specific audio sources. Other automatic recognition techniques may alternatively be used. In some embodiments, automatic recognition of an audio source may be triggered by a user, for example by pressing a button on the audio controller 102 (not shown in FIG. 2), or by actuating a key on the touchscreen of mobile device 152. In response to detecting the type of audio source, processor 106 and/or processor 156 may automatically adjust the gain of an amplifier. For example, the processor may be configured to set a higher gain for guitar or voice recordings, and a lower gain for drums or bass recordings.

In yet another example, automatic sound equalization may be performed. In some circumstances, it may be desirable to adjust the frequency content of an audio output based on a certain characteristic of the audio input (e.g., the music genre) and/or the surrounding environment. In some embodiments, when an audio input is received, processor 106 and/or processor 156 may analyze the spectral content of the audio input. For example, the processor(s) may segment the spectrum of the audio input into sub-bands, and may determine the level of the audio input within such sub-bands. Based on these levels and on the desired spectral output, the processor(s) may adjust the spectral content of the audio input. Adjustment of the spectral content of an audio input may be performed in any suitable way. For example, a digital filter may be used. The digital filter may be designed to produce a desired spectral content (e.g., to equalize) across a bandwidth of interest (e.g., between 20 HZ and 20 KHz or between any values within such range). The digital filter may be configured to attenuate the level of certain sub-bands, and/or amplify the level of other sub-bands. In this way, a desired spectral output may be obtained. In some embodiments, automatic sound equalization may be performed in response to detecting what type of audio source has been plugged in. The way in which the spectral content of the audio input is modified may depend on the type of the detected audio source.

C. Automatically Creating and Mapping Tracks

The Assignee has appreciated that the process of mapping tracks to audio inputs is often cumbersome. For example, in some circumstances, an audio engineer manually performs multiple steps, including generating an empty track in a software application, importing a file containing an audio input into the software application, and mapping the file to the empty track. This method may be cumbersome, as multiple steps may be needed before the desired condition is reached.

Figure 11A:
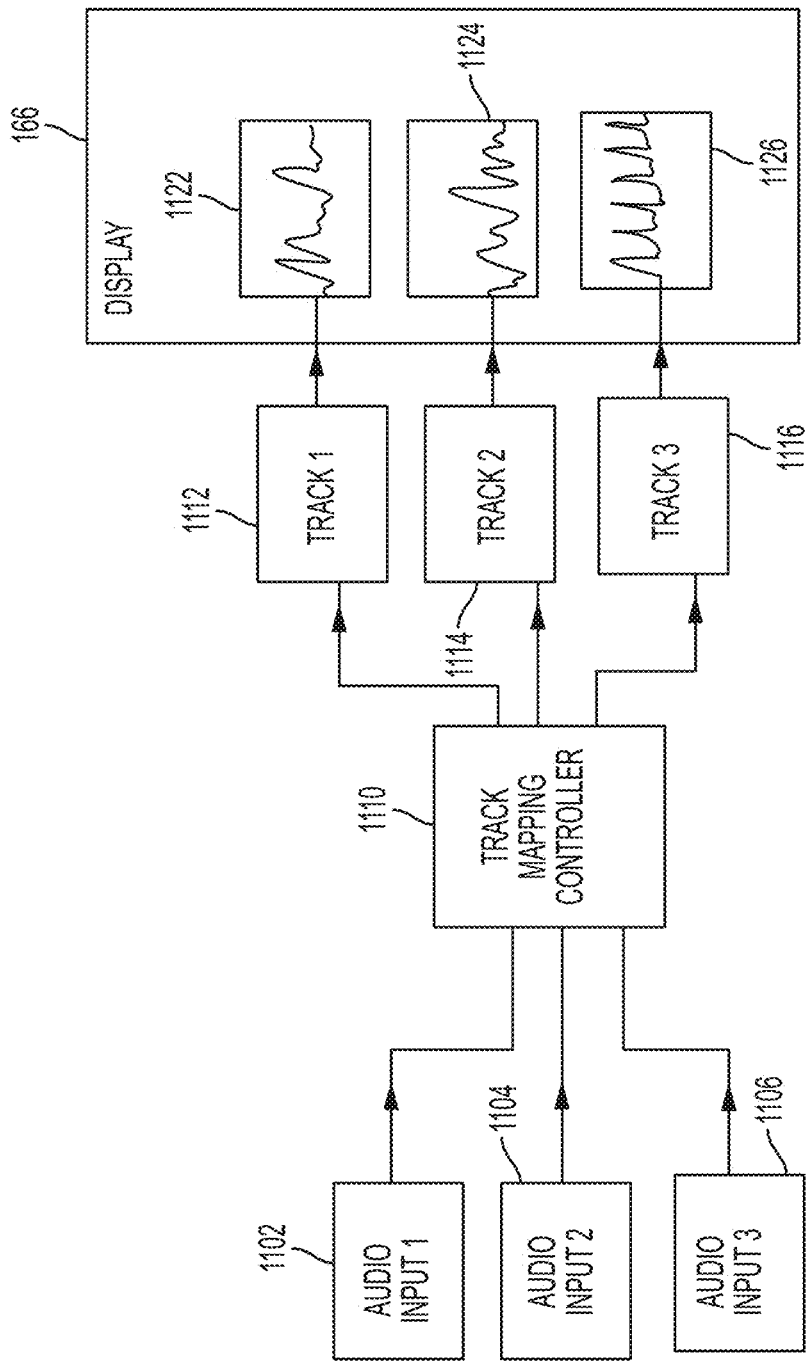
FIG. 11A is a block diagram illustrating an audio recording system having a track mapping controller, according to some non-limiting embodiments.

In some embodiments, the mapping may be automated using a track mapping controller. FIG. 11A is a block diagram illustrating a track mapping controller. In some embodiments, a plurality of audio inputs may be received using the audio input ports of audio controller 102 or the audio input ports of mobile device 152. For example, audio inputs 1102, 1104 and 1106 may be received. The received audio inputs may be provided to track mapping controller 1110, which may be implemented using processor 106 or 156. Track mapping controller 1110 may detect the number of audio inputs received, and may automatically create a track for each of the audio inputs. Each track may be mapped to a corresponding audio input, and may be stored in a memory. For example, track 1112 may be mapped to audio input 1102, track 1114 may be mapped to audio input 1104, and track 1116 may be mapped to audio input 1106. In some embodiments, the tracks may be rendered on display 166. In these embodiments, processor 156 may generate, for each track stored in the memory, data for rendering a corresponding waveform in the manner described above. For example, track 1112 may be mapped to waveform 1122, track 1114 may be mapped to waveform 1124, and track 1116 may be mapped to waveform 1126. The waveforms may be rendered on display 166.

Figure 11B:
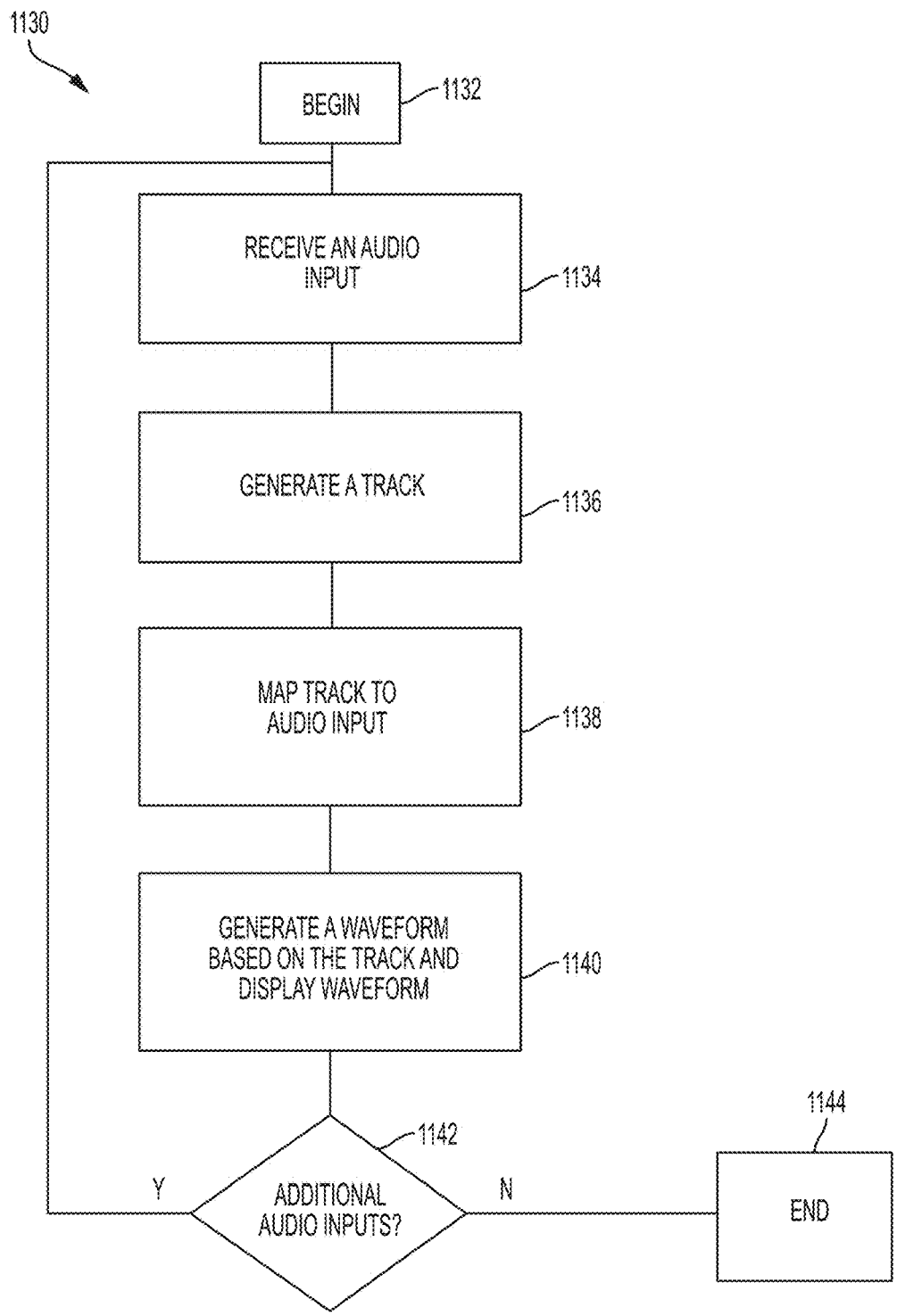
FIG. 11B is a flowchart illustrating a method for automatically mapping audio inputs to tracks, according to some non-limiting embodiments.

FIG. 11B is a flowchart illustrating a method for mapping audio inputs to tracks. Method 1130 may begin at act 1132. At act 1134, an audio input may be received. The audio input may be received through an audio input port. At act, 1136, a track may be created. Creation of a track may be performed in any suitable way. For example, creating a track may comprise allocating dedicated space on a memory device for an audio input. At act 1138, the track may be mapped to the received audio input. Optionally, at act 1140, a waveform may be generated based on the track, and the waveform may be rendered on a display (e.g., a display of a mobile device). At act 1142, it is determined whether additional audio inputs are received. If no additional audio inputs are received the method ends at act 1144. Otherwise, if an additional audio input is received, the method may continue to iterate.

In some embodiments, when a new track is automatically created, the processor(s) may be further configured to adjust the gain of an amplifier, such as amplifier 113 and/or amplifier 159. The gain of the amplifier(s) may be performed in response to receiving instructions from a user, or may be performed automatically upon creation of a new track.

In some circumstances, a user may want to pause a recording session. Accordingly, the user may first hit a pause key, such as stop button 206, and then hit a resume recording key, such as record button 202, at a later time. In some embodiments, in response to receiving a request to continue to record, a new track may be created and the recorded audio input may be associated with such new track. In other embodiments, in response to receiving a request to continue to record, a pre-existing track may be used. In these embodiments, audio data may be attached to the pre-existing track.

V. Implementation Detail

Figure 12:
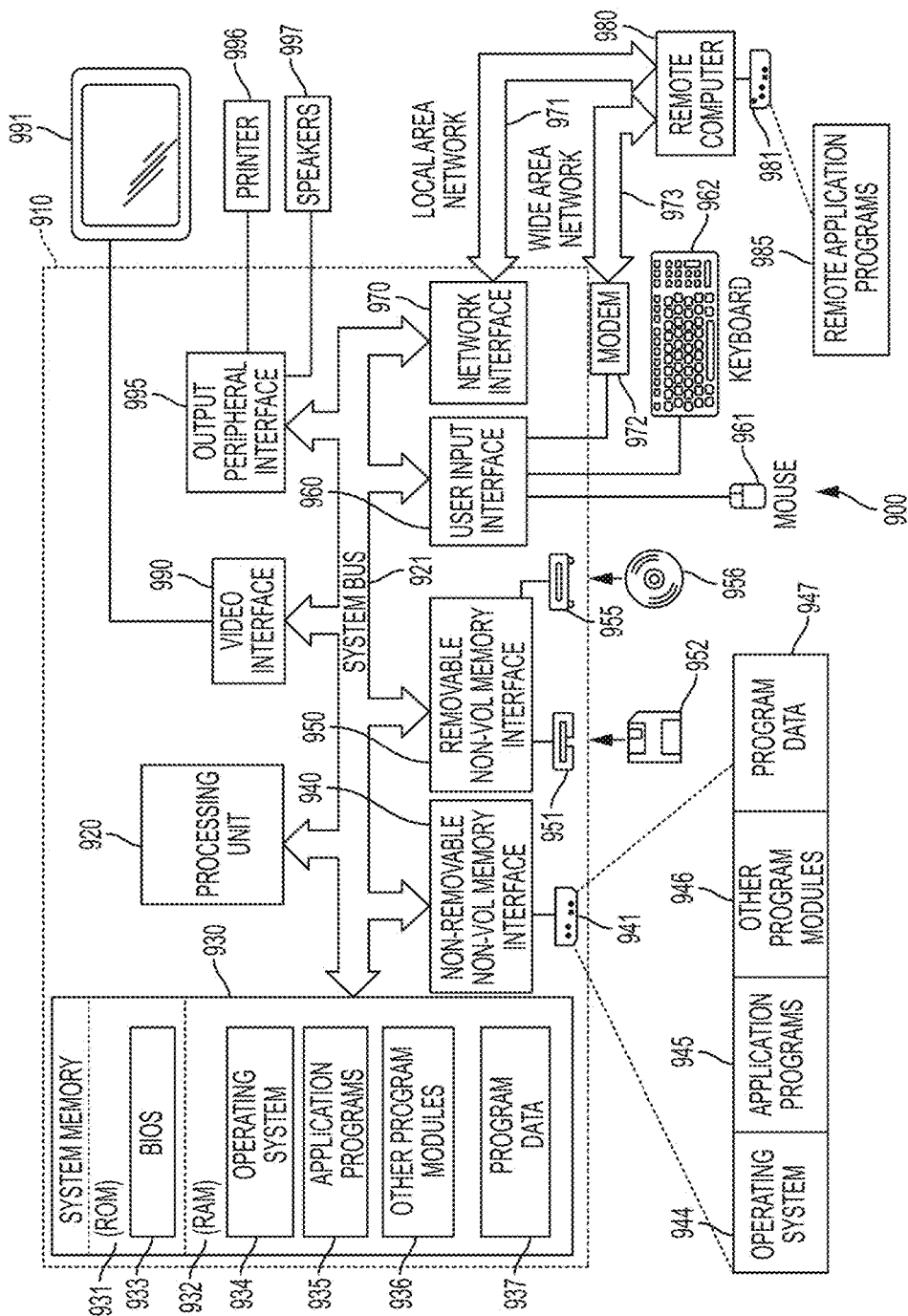
FIG. 12 is a block diagram illustrating a computer system, according to some non-limiting embodiments.

FIG. 12 depicts a general purpose computing device, in the form of a computer 910, which may be used to implement certain aspects of the invention. For example, computer 910 or components thereof may constitute any of the audio controllers, mobile devices, and/or networking components described above.

In computer 910, components include, but are not limited to, a processing unit 920, a system memory 930, and a system bus 921 that couples various system components including the system memory to the processing unit 920. The system bus 921 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

Computer 910 typically includes a variety of computer readable media. Computer readable media can be any available media that can be accessed by computer 910 and includes both volatile and nonvolatile media, removable and non-removable media. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media include, but are not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other one or more media which may be used to store the desired information and may be accessed by computer 910. Communication media typically embody computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared and other wireless media. Combinations of the any of the above should also be included within the scope of computer readable media.

The system memory 930 includes computer storage media in the form of volatile and/or nonvolatile memory such as read only memory (ROM) 931 and random access memory (RAM) 932. A basic input/output system 933 (BIOS), containing the basic routines that help to transfer information between elements within computer 910, such as during start-up, is typically stored in ROM 931. RAM 932 typically contains data and/or program modules that are immediately accessible to and/or presently being operated on by processing unit 920. By way of example, and not limitation, FIG. 12 illustrates operating system 934, application programs 935, other program modules 939, and program data 937.

The computer 910 may also include other removable/non-removable, volatile/nonvolatile computer storage media. By way of example only, FIG. 12 illustrates a hard disk drive 941 that reads from or writes to non-removable, nonvolatile magnetic media, a magnetic disk drive 951 that reads from or writes to a removable, nonvolatile magnetic disk 952, and an optical disk drive 955 that reads from or writes to a removable, nonvolatile optical disk 959 such as a CD ROM or other optical media. Other removable/non-removable, volatile/nonvolatile computer storage media that can be used in the exemplary computing system include, but are not limited to, magnetic tape cassettes, flash memory cards, digital versatile disks, digital video tape, solid state RAM, solid state ROM, and the like. The hard disk drive 941 is typically connected to the system bus 921 through an non-removable memory interface such as interface 940, and magnetic disk drive 951 and optical disk drive 955 are typically connected to the system bus 921 by a removable memory interface, such as interface 950.

The drives and their associated computer storage media discussed above and illustrated in FIG. 12, provide storage of computer readable instructions, data structures, program modules and other data for the computer 910. In FIG. 12, for example, hard disk drive 941 is illustrated as storing operating system 944, application programs 945, other program modules 949, and program data 947. Note that these components can either be the same as or different from operating system 934, application programs 935, other program modules 539, and program data 937. Operating system 944, application programs 945, other program modules 949, and program data 947 are given different numbers here to illustrate that, at a minimum, they are different copies. A user may enter commands and information into the computer 910 through input devices such as a keyboard 992 and pointing device 991, commonly referred to as a mouse, trackball or touch pad. Other input devices (not shown) may include a microphone, joystick, game pad, satellite dish, scanner, or the like. These and other input devices are often connected to the processing unit 920 through a user input interface 590 that is coupled to the system bus, but may be connected by other interface and bus structures, such as a parallel port, game port or a universal serial bus (USB). A monitor 991 or other type of display device is also connected to the system bus 921 via an interface, such as a video interface 990. In addition to the monitor, computers may also include other peripheral output devices such as speakers 997 and printer 999, which may be connected through a output peripheral interface 995.

The computer 910 may operate in a networked environment using logical connections to one or more remote computers, such as a remote computer 980. The remote computer 980 may be a personal computer, a server, a router, a network PC, a peer device or other common network node, and typically includes many or all of the elements described above relative to the computer 910, although only a memory storage device 981 has been illustrated in FIG. 12. The logical connections depicted in FIG. 12 include a local area network (LAN) 971 and a wide area network (WAN) 973, but may also include other networks. Such networking environments are commonplace in offices, enterprise-wide computer networks, intranets and the Internet.

When used in a LAN networking environment, the computer 910 is connected to the LAN 971 through a network interface or adapter 970. When used in a WAN networking environment, the computer 910 typically includes a modem 972 or other means for establishing communications over the WAN 973, such as the Internet. The modem 972, which may be internal or external, may be connected to the system bus 921 via the user input interface 990, or other appropriate mechanism. In a networked environment, program modules depicted relative to the computer 910, or portions thereof, may be stored in the remote memory storage device. By way of example, and not limitation, FIG. 12 illustrates remote application programs 985 as residing on memory device 981. It will be appreciated that the network connections shown are exemplary and other means of establishing a communications link between the computers may be used.

Embodiments of the invention may be embodied as a computer readable storage medium (or multiple computer readable media) (e.g., a computer memory, one or more floppy discs, compact discs (CD), optical discs, digital video disks (DVD), magnetic tapes, flash memories, circuit configurations in Field Programmable Gate Arrays or other semiconductor devices, or other tangible computer storage medium) encoded with one or more programs that, when executed on one or more computers or other processors, perform methods that implement the various embodiments of the invention discussed above. As is apparent from the foregoing examples, a computer readable storage medium may retain information for a sufficient time to provide computer-executable instructions in a non-transitory form. Such a computer readable storage medium or media can be transportable, such that the program or programs stored thereon can be loaded onto one or more different computers or other processors to implement various aspects of the present invention as discussed above. As used herein, the term "computer-readable storage medium" encompasses only a tangible machine, mechanism or device from which a computer may read information. Alternatively or additionally, the invention may be embodied as a computer readable medium other than a computer-readable storage medium. Examples of computer readable media which are not computer readable storage media include transitory media, like propagating signals.

Having thus described several aspects of at least one embodiment of this invention, it is to be appreciated that various alterations, modifications, and improvements will readily occur to those skilled in the art. Such alterations, modifications, and improvements are intended to be part of this disclosure, and are intended to be within the spirit and scope of the invention. Further, though advantages of the present invention are indicated, it should be appreciated that not every embodiment of the invention will include every described advantage. Some embodiments may not implement any features described as advantageous herein and in some instances. Accordingly, the foregoing description and drawings are by way of example only.

Various aspects of the present invention may be used alone, in combination, or in a variety of arrangements not specifically discussed in the embodiments described in the foregoing, and it is, therefore, not limited in its application to the details and arrangement of components set forth in the foregoing description or illustrated in the drawings. For example, aspects described in one embodiment may be combined in any manner with aspects described in other embodiments.

The invention may be embodied as a method, of which various examples have been described. The acts performed as part of the method may be ordered in any suitable way. Accordingly, embodiments may be constructed in which acts are performed in an order different than illustrated, which may include different (e.g., more or less) acts than those which are described, and/or which may involve performing some acts simultaneously, even though the acts are shown as being performed sequentially in the embodiments specifically described above.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

The invention claimed is:

1. A method for use with an audio system comprising at least one amplifier, the method comprising acts of:
   (A) receiving, at the audio system, audio input produced by at least one audio source;
   (B) determining a gain level associated with the audio input;
   (C) automatically, without intervention by a user of the audio system, adjusting a gain level of the at least one amplifier, so that subsequent output of the at least one amplifier falls within a dynamic range delimited by a lower gain level and an upper gain level;
   wherein the at least one audio source comprises at least one musical instrument, the act (A) comprises identifying the at least one musical instrument from the received audio input, and the act (C) comprises adjusting the gain level of the at least one amplifier in a manner corresponding to the identified musical instrument; and wherein the act (A) comprises identifying the at least one musical instrument as a guitar, voice, bass or drum, and the act (C) comprises setting the gain level of the at least one amplifier to be a different gain level if the at least one musical instrument were identified as a guitar or voice than if the at least one musical instrument were identified as a bass or drum.

2. The method of claim 1, wherein the act (A) comprises identifying the at least one musical instrument as a guitar or voice, and the act (C) comprises setting the gain level of the at least one amplifier to be a higher gain level than if the at least one musical instrument were identified as a bass or drum.

3. The method of claim 1, wherein the act (A) comprises identifying the at least one musical instrument as a bass or drum, and the act (C) comprises setting the gain level of the at least one amplifier to be a lower gain level than if the at least one musical instrument were identified as a guitar or voice.

4. The method of claim 1, wherein the audio system comprises a sound emitting device coupled to the at least one amplifier, and wherein the act (C) comprises adjusting a gain level of the at least one amplifier and/or the sound emitting device so that subsequent output of the at least one amplifier and the sound emitting device falls within a dynamic range in which response of the at least one amplifier and of the sound emitting device is substantially linear.

5. The method of claim 1, wherein the audio system comprises a sound emitting device coupled to the at least one amplifier, and wherein the act (C) comprises adjusting a gain level of the at least one amplifier and/or of the sound emitting device so that subsequent output of the at least one amplifier and the sound emitting device includes less than 10% harmonic distortion.

6. The method of claim 5, wherein the act (C) comprises adjusting a gain level of the at least one amplifier and/or of the sound emitting device so that subsequent output of the at least one amplifier and the sound emitting device includes less than 5% harmonic distortion.

7. The method of claim 6, wherein the act (C) comprises adjusting a gain level of the at least one amplifier and/or of the sound emitting device so that subsequent output of the at least one amplifier and the sound emitting device includes less than 3% harmonic distortion.

8. The method of claim 1, wherein the at least one amplifier comprises a plurality of amplifiers, and the act (C) comprises adjusting a gain level of each of the plurality of amplifiers so that subsequent output produced by the plurality of amplifiers is within the dynamic range.

9. The method of claim 8, wherein the plurality of amplifiers comprises at least one amplifier of an audio controller and at least one amplifier of a mobile device.

10. The method of claim 1, wherein the at least one amplifier comprises a plurality of amplifiers, and the act (C) comprises setting a gain level of each of the plurality of amplifiers to be substantially equal.

11. The method of claim 1, wherein the act (B) comprises analyzing spectral content of the received audio input in each of a plurality of frequency sub-bands, and the act (C) comprises adjusting the spectral content of subsequent output of the at least one amplifier in one or more of the frequency sub-bands.

12. The method of claim 11, wherein the act (C) comprises equalizing a gain level across one or more of the frequency sub-bands.

13. The method of claim 11, wherein the act (C) comprises attenuating a gain level in one or more of the frequency sub-bands.

14. The method of claim 11, wherein the act (C) comprises increasing a gain level in one or more of the frequency sub-bands.

15. The method of claim 1, wherein the at least one audio source comprises one or more of a human voice and a musical instrument.

16. The method of claim 1, wherein the audio system comprises a mobile device, and wherein one or more of the acts (A), (B) and (C) are performed using components of the mobile device.

17. An audio system, comprising:
at least one amplifier;
at least one computer-readable storage medium, having instructions encoded thereon; and
at least one computer processor, operatively coupled to the at least one amplifier, the at least one computer processor being programmed via the instructions to:
receive audio input produced by at least one audio source;
determine a gain level associated with the audio input;
automatically, without intervention by a user of the audio system, adjust a gain level of the at least one amplifier, so that subsequent output of the at least one amplifier falls within a dynamic range delimited by a lower gain level and an upper gain level;
wherein:
the at least one audio source comprises at least one musical instrument;
the at least one computer processor is programmed via the instructions to identify the at least one musical instrument from the received audio input, and to adjust the gain level of the at least one amplifier in a manner corresponding to the identified musical instrument;
the at least one computer processor is programmed via the instructions to identify the at least one musical instrument as a guitar, voice, bass or drum, and to set the gain level of the at least one amplifier to be a different gain level if the at least one musical instrument is identified as a guitar or voice than if the at least one musical instrument is identified as a bass or drum.

18. The audio system of claim 17, wherein the at least one computer processor is programmed via the instructions to identify the at least one musical instrument as a guitar or voice, and to set the gain level of the at least one amplifier to be a higher gain level than if the at least one musical instrument were identified as a bass or drum.

19. The audio system of claim 17, wherein the at least one computer processor is programmed via the instructions to identify the at least one musical instrument as a bass or drum, and to set the gain level of the at least one amplifier to be a lower gain level than if the at least one musical instrument were identified as a guitar or voice.

20. The audio system of claim 17, comprising a sound emitting device coupled to the at least one amplifier, and wherein the at least one computer processor is programmed via the instructions to adjust a gain level of the at least one amplifier and/or the sound emitting device so that subsequent output of the at least one amplifier and the sound emitting device falls within a dynamic range in which response of the at least one amplifier and of the sound emitting device is substantially linear.

21. The audio system of claim 17, comprising a sound emitting device coupled to the at least one amplifier, and wherein the at least one computer processor is programmed via the instructions to adjust a gain level of the at least one amplifier and/or of the sound emitting device so that subsequent output of the at least one amplifier and the sound emitting device includes less than 10% harmonic distortion.

22. The audio system of claim 21, wherein the at least one computer processor is programmed via the instructions to adjust a gain level of the at least one amplifier and/or of the sound emitting device so that subsequent output of the at least one amplifier and the sound emitting device includes less than 5% harmonic distortion.

23. The audio system of claim 22, wherein the at least one computer processor is programmed via the instructions to adjust a gain level of the at least one amplifier and/or of the sound emitting device so that subsequent output of the at least one amplifier and the sound emitting device includes less than 3% harmonic distortion.

24. The audio system of claim 17, wherein the at least one amplifier comprises a plurality of amplifiers, and the at least one computer processor is programmed via the instructions to adjust a gain level of each of the plurality of amplifiers so that subsequent output produced by the plurality of amplifiers is within the dynamic range.

25. The audio system of claim 24, wherein the plurality of amplifiers comprises at least one amplifier of an audio controller and at least one amplifier of a mobile device.

26. The audio system of claim 17, wherein the at least one amplifier comprises a plurality of amplifiers, and the at least one computer processor is programmed via the instructions to set a gain level of each of the plurality of amplifiers to be substantially equal.

27. The audio system of claim 17, wherein the at least one computer processor is programmed via the instructions to analyze spectral content of the received audio input in each of a plurality of frequency sub-bands, and to adjust the spectral content of subsequent output of the at least one amplifier in one or more of the frequency sub-bands.

28. The audio system of claim 27, wherein the at least one computer processor is programmed via the instructions to equalize a gain level across one or more of the frequency sub-bands.

29. The audio system of claim 27, wherein the at least one computer processor is programmed via the instructions to attenuate a gain level in one or more of the frequency sub-bands.

30. The audio system of claim 27, wherein the at least one computer processor is programmed via the instructions to increase a gain level in one or more of the frequency sub-bands.

31. The audio system of claim 17, wherein the at least one audio source comprises one or more of a human voice and a musical instrument.

32. The audio system of claim 17, comprising a mobile device, and wherein the at least one computer processor comprises a component of the mobile device.

* * * * *